United States Patent
Koga

(10) Patent No.: US 9,443,816 B2
(45) Date of Patent: Sep. 13, 2016

(54) SEMICONDUCTOR DEVICE

(71) Applicant: ROHM CO., LTD., Kyoto-shi, Kyoto (KR)

(72) Inventor: Akihiro Koga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/717,757

(22) Filed: May 20, 2015

(65) Prior Publication Data

US 2015/0340350 A1    Nov. 26, 2015

(30) Foreign Application Priority Data

May 21, 2014   (JP) ................................ 2014-105233

(51) Int. Cl.
*H01L 23/495* (2006.01)
*H01L 23/00* (2006.01)
(Continued)

(52) U.S. Cl.
CPC ........... *H01L 24/40* (2013.01); *H01L 23/3107* (2013.01); *H01L 23/3675* (2013.01); *H01L 23/3736* (2013.01); *H01L 23/48* (2013.01); *H01L 23/49822* (2013.01); *H01L 23/49838* (2013.01); *H01L 23/49894* (2013.01); *H01L 24/33* (2013.01); *H01L 24/48* (2013.01); *H01L 24/49* (2013.01); *H01L 24/73* (2013.01); *H01L 24/85* (2013.01); *H01L 25/07* (2013.01); *H01L 25/072* (2013.01); *H01L 25/16* (2013.01); *H01L 25/18* (2013.01); *H01L 2224/32227* (2013.01); *H01L 2224/40137* (2013.01); *H01L 2224/40139* (2013.01); *H01L 2224/45139* (2013.01); *H01L 2224/48091* (2013.01); *H01L 2224/48106* (2013.01); *H01L 2224/48137* (2013.01); *H01L 2224/48247* (2013.01); *H01L 2224/48465* (2013.01); *H01L 2224/48997* (2013.01); *H01L 2224/49171* (2013.01); *H01L 2224/73265* (2013.01); *H01L 2224/78301* (2013.01);
(Continued)

(58) Field of Classification Search
CPC ................... H01L 23/4334; H01L 23/49541; H01L 23/49568; H01L 23/293; H01L 23/49503; H01L 23/3121; H01L 23/3675; H01L 23/49894; H01L 24/40
USPC .................................................. 257/666, 723
See application file for complete search history.

(56) References Cited

U.S. PATENT DOCUMENTS 6,400,004 B1 * 6/2002 Fan ..................... H01L 23/3107
257/666
7,589,400 B2 * 9/2009 Hozoji .................... H01L 24/36
257/673

(Continued)

FOREIGN PATENT DOCUMENTS

JP        2011-243839 A    12/2011

*Primary Examiner* — Nitin Parekh
(74) *Attorney, Agent, or Firm* — Hamre, Schumann, Mueller & Larson, P.C.

(57) ABSTRACT

A semiconductor device includes a semiconductor element, a substrate, a lead, and a sealing resin member. The semiconductor element has a first electrode and a second electrode located on opposite sides in the thickness direction. The substrate has an insulating base and a conductive plate. The base has first and second surfaces located on opposite sides in the thickness direction. The conductive plate is bonded to the first surface of the base and electrically connected to the second electrode of the semiconductor element. The lead has an island electrically connected to the first electrode. The sealing resin member covers at least the semiconductor element.

42 Claims, 16 Drawing Sheets

(51) Int. Cl.
  *H01L 25/16* (2006.01)
  *H01L 23/498* (2006.01)
  *H01L 23/31* (2006.01)
  *H01L 23/367* (2006.01)
  *H01L 23/373* (2006.01)
  *H01L 25/07* (2006.01)
  *H01L 23/48* (2006.01)
  *H01L 25/18* (2006.01)

(52) U.S. Cl.
  CPC ............ *H01L2224/85181* (2013.01); *H01L 2224/85951* (2013.01); *H01L 2924/01029* (2013.01); *H01L 2924/01047* (2013.01); *H01L 2924/05432* (2013.01); *H01L 2924/1203* (2013.01); *H01L 2924/13055* (2013.01); *H01L 2924/13091* (2013.01); *H01L 2924/1426* (2013.01); *H01L 2924/1517* (2013.01); *H01L 2924/15153* (2013.01); *H01L 2924/15787* (2013.01)

(56) References Cited

U.S. PATENT DOCUMENTS

| | | | | |
|---|---|---|---|---|
| 7,763,974 B2 * | 7/2010 | Takahashi | ............... | H01L 24/49 257/690 |
| 8,552,541 B2 * | 10/2013 | Lim | ................... | H01L 23/4334 257/675 |
| 2002/0096748 A1 * | 7/2002 | Pavier | ............... | H01L 23/49575 257/670 |
| 2007/0138624 A1 * | 6/2007 | Sudo | ................... | H01L 23/3121 257/706 |
| 2013/0062745 A1 * | 3/2013 | Kimura | ............... | H01L 23/4334 257/675 |
| 2014/0027891 A1 * | 1/2014 | Kimura | ............... | H01L 23/3107 257/675 |
| 2014/0284784 A1 * | 9/2014 | Yasunaga | ................ | H01L 23/52 257/690 |

* cited by examiner

FIG.22
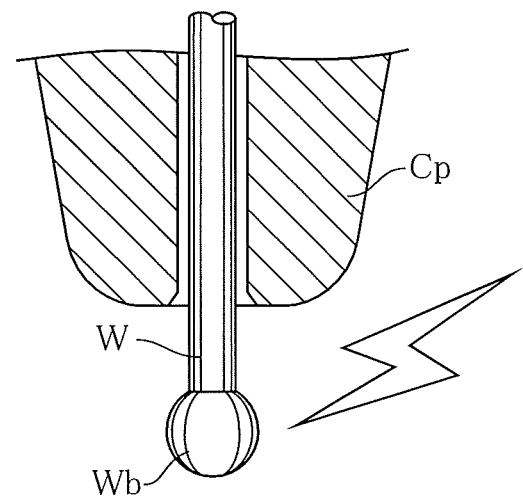
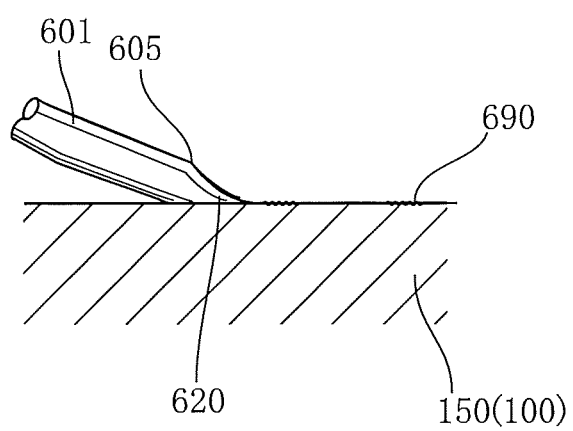

SEMICONDUCTOR DEVICE

BACKGROUND OF THE INVENTION

1. Field of the Invention

The present invention relates to a semiconductor device.

2. Description of Related Art

As one of various types of semiconductor devices, an intelligent power module (IPM) is conventionally known (see JP-A-2011-243839, for example). This semiconductor device includes a plurality of semiconductor elements, a lead having a plurality of islands, a heat dissipation member, and a sealing resin member. The plurality of semiconductor elements are mounted individually on the plurality of islands. The islands are bonded to the heat dissipation member. The sealing resin member covers the plurality of semiconductor elements, the plurality of islands, and the heat dissipation member. Each of the semiconductor elements is conductively connected to another semiconductor device or the lead via a wire.

In the above structure, the magnitude of the current allowed to flow to each semiconductor element depends on the current-carrying capacity of the wire. Therefore, there is a possibility that the amount of current flow may not be sufficient to operate a motor that requires a comparatively large current, for example, via such a semiconductor element.

SUMMARY OF THE INVENTION

The present invention has been proposed under the circumstances described above. It is therefore an objective of the invention to provide a semiconductor device through which a large current can be fed.

According to an aspect of the present invention, there is provided a semiconductor device including: at least one semiconductor element having a first electrode and a second electrode that are opposite to each other in a thickness direction; a substrate including an insulating base and a conductive plate, where the insulating base includes a first surface and a second surface that are opposite to each other in the thickness direction, and the conductive plate is bonded to the first surface of the base and electrically connected to the second electrode of the semiconductor element; a lead including an island electrically connected to the first electrode; and a sealing resin member covering the semiconductor element.

Preferably, the base is made of ceramic such as alumina.

Preferably, the conductive plate is made of metal such as Cu.

Preferably, the conductive plate is not smaller in thickness than the base. That is, the thickness of the conductive plate is equal to that of the base or greater than that of the base.

In an embodiment, the semiconductor device further includes a heat dissipation plate bonded to the second surface of the base.

Preferably, the heat dissipation plate has an exposed surface exposed from the sealing resin member.

Preferably, the exposed surface of the heat dissipation plate is flush with a surface of the sealing resin member.

Preferably, the heat dissipation plate is made of metal such as Cu.

Preferably, the heat dissipation plate is not smaller in thickness than the base.

In an embodiment, use is made of a plurality of semiconductor elements, and the island of the lead is electrically connected to the first electrodes of the plurality of semiconductor elements.

Preferably, the lead includes a conductive portion electrically connected to the conductive plate of the substrate.

Preferably, the island is formed with a plurality of recesses.

Preferably, the island has a smooth part that coincides with the semiconductor element.

Preferably, each of the recesses is circular in section.

Preferably, the plurality of recesses are arranged to surround the semiconductor element.

Preferably, the semiconductor element is a power semiconductor element through which an operating current flows.

In an embodiment, the semiconductor device further includes a bonding material that bonds the first electrode and the island. When the bonding material is in a molten state, the first electrode is greater in wettability with respect to the bonding material than is the island.

Preferably, the first electrode covers the entirety of one surface of the semiconductor element.

Preferably, the island is formed with a groove located outside the semiconductor element.

Preferably, the bonding material lies inside the groove.

Preferably, the groove surrounds the semiconductor element as a whole.

Preferably, the island is formed with a plurality of recesses located outside the groove.

In an embodiment, the semiconductor device further includes a drive IC through which a control current flows for controlling the operating current.

In an embodiment, the semiconductor device further includes a first wire for connecting the drive IC to the conductive plate of the substrate.

Preferably, the conductive plate includes an extension that protrudes from the semiconductor element as viewed in plan and is connected to the drive IC via the first wire.

Preferably, the extension is provided with a bonding chip to which the first wire is bonded.

Preferably, the bonding chip includes a lower layer and an upper layer laminated to the lower layer, where the lower layer is closer to the conductive plate than is the upper layer in the thickness direction.

Preferably, the lower layer is made of Cu, while the upper layer is made of Ag.

In an embodiment, the semiconductor device further includes a second wire connected to the drive IC, where the second wire includes a first bonding portion, a step portion, a second bonding portion and a reinforced bonding portion. The second bonding portion has a shape that gradually decreases in thickness with increasing distance from the step portion. The reinforced bonding portion overlaps at least a part of the second bonding portion and exposes the step portion.

Preferably, the reinforced bonding portion has a disk portion in contact with the second bonding portion.

Preferably, the reinforced bonding portion has a column portion that is formed on the disk portion, is smaller in diameter than the disk portion, and is concentric with the disk portion. Preferably, the reinforced bonding portion includes a spire portion formed on the column portion.

In an embodiment, the semiconductor device further includes an annular mark formed by a capillary pressed in forming the second bonding portion.

Preferably, the reinforced bonding portion exposes a part of the annular mark.

Preferably, the reinforced bonding portion covers at least a half of the annular mark located adjacent to the second bonding portion.

Preferably, the first bonding portion is bonded to the drive IC.

Preferably, the second bonding portion is bonded to the lead.

Preferably, the second boding portion is bonded to the bonding chip.

Preferably, the wire is made of Au.

Preferably, the lead includes a terminal that is connected to the island and exposed from the sealing resin member.

Preferably, the substrate includes a terminal that protrudes from the sealing resin member.

Other features and advantages of the invention will become more apparent from the following detailed description taken with reference to the accompanying drawings.

BRIEF DESCRIPTION OF THE DRAWINGS

FIGS. 16 to 24 are illustrations showing a process of manufacturing a wire of the semiconductor device of FIG. 1.

DESCRIPTION OF THE PREFERRED EMBODIMENTS

Figure 1:
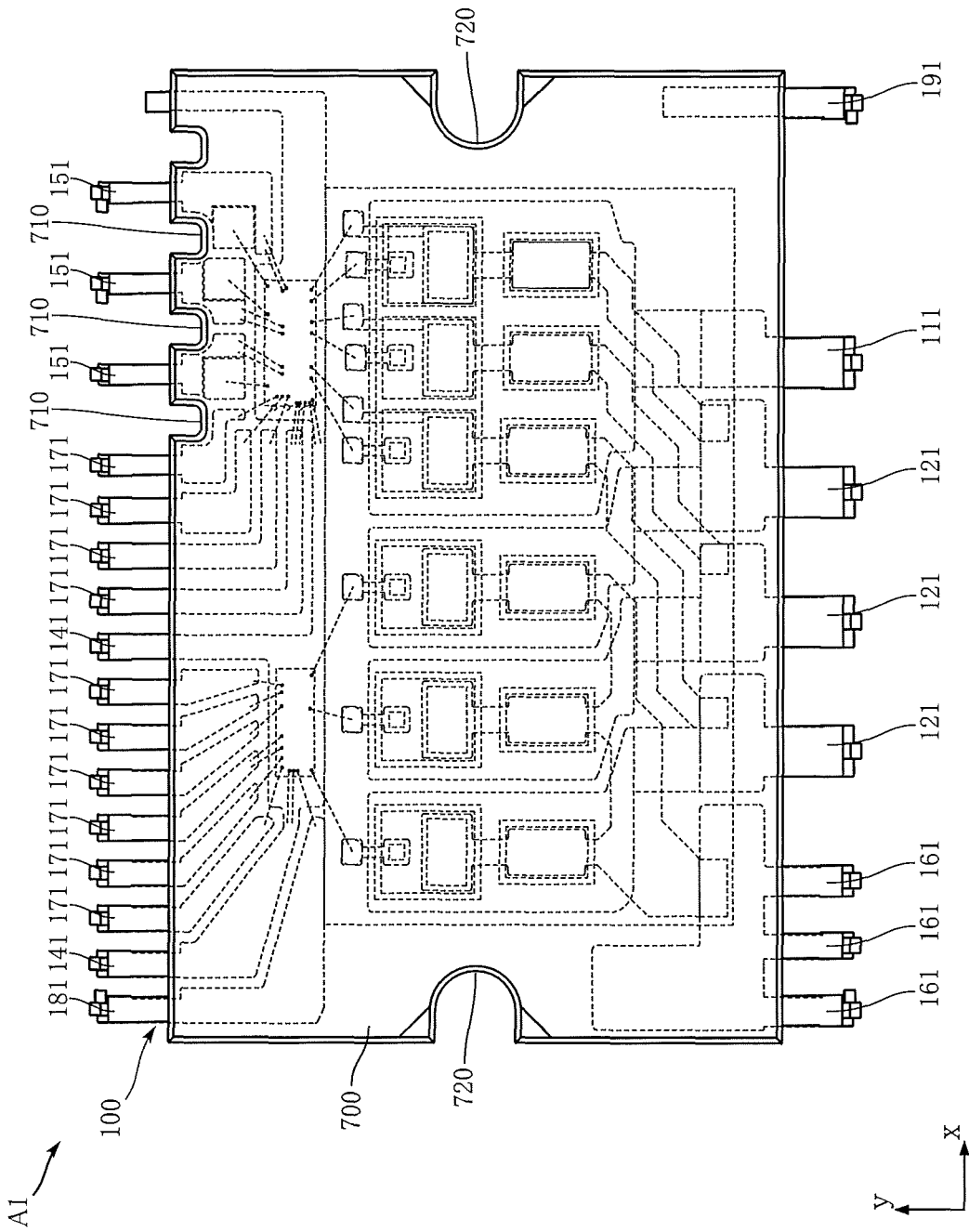
FIG. 1 is a plan view showing a semiconductor device according to a first embodiment of the invention.

Preferred embodiments of the present invention will be described hereinafter with reference to the accompanying drawings.

FIGS. 1 to 8 show a semiconductor device according to the first embodiment of the invention. The semiconductor device A1 of this embodiment includes a lead 100, a substrate 200, a plurality of semiconductor elements 410, a plurality of semiconductor elements 420, a drive IC 430, a drive IC 440, a plurality of passive components 490, a plurality of wires 600, and a sealing resin member 700. The semiconductor device A1 is configured as an IPM used for control of the operating current of an inverter motor, for example. An example of the size of the semiconductor device A1 is about 38 mm in the x direction, about 24 mm in the y direction, and about 3.5 mm in the z direction (which is the thickness of the sealing resin member 700).

Figure 2:
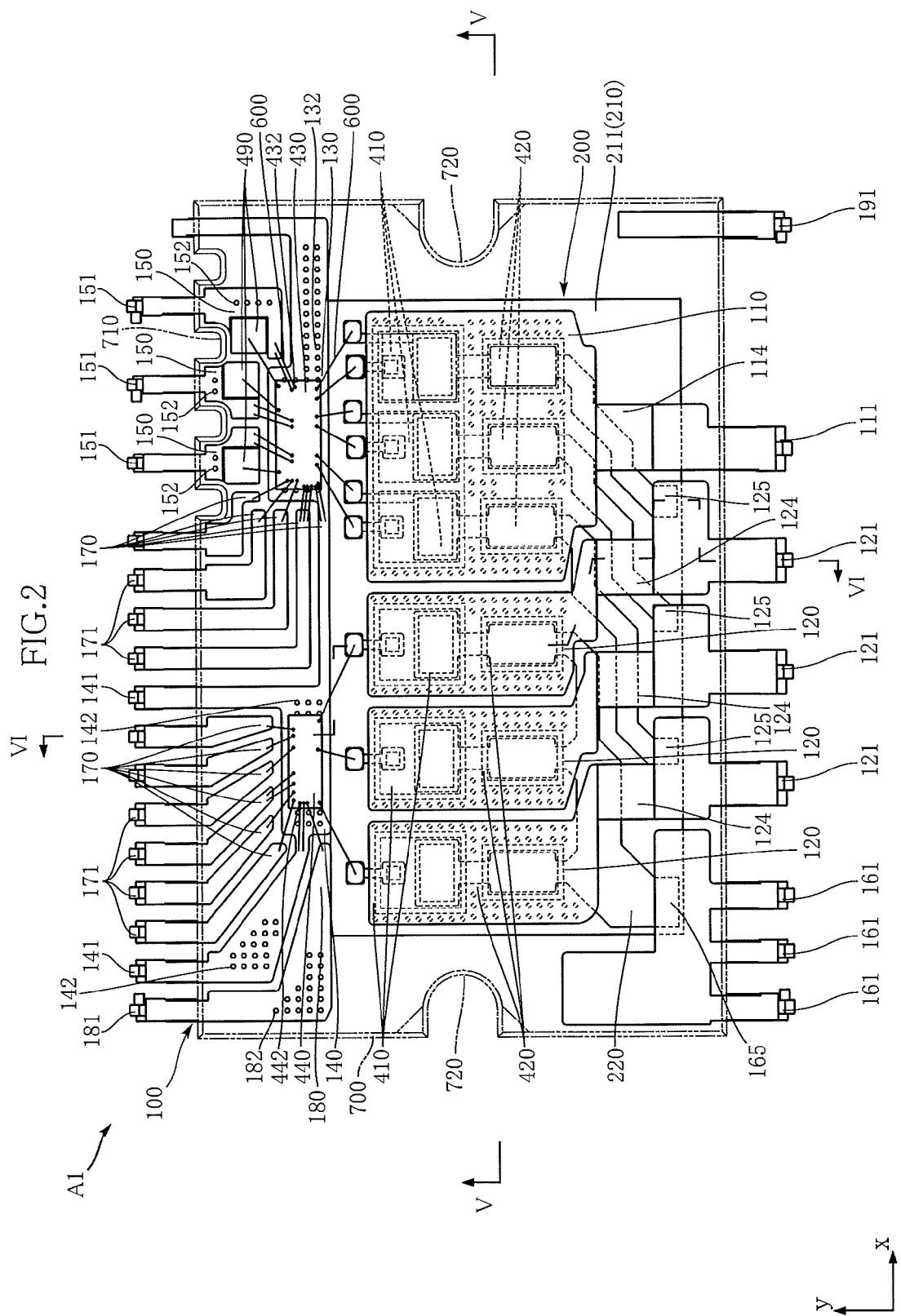
FIG. 2 is a plan view showing the semiconductor device of FIG. 1.
Figure 3:
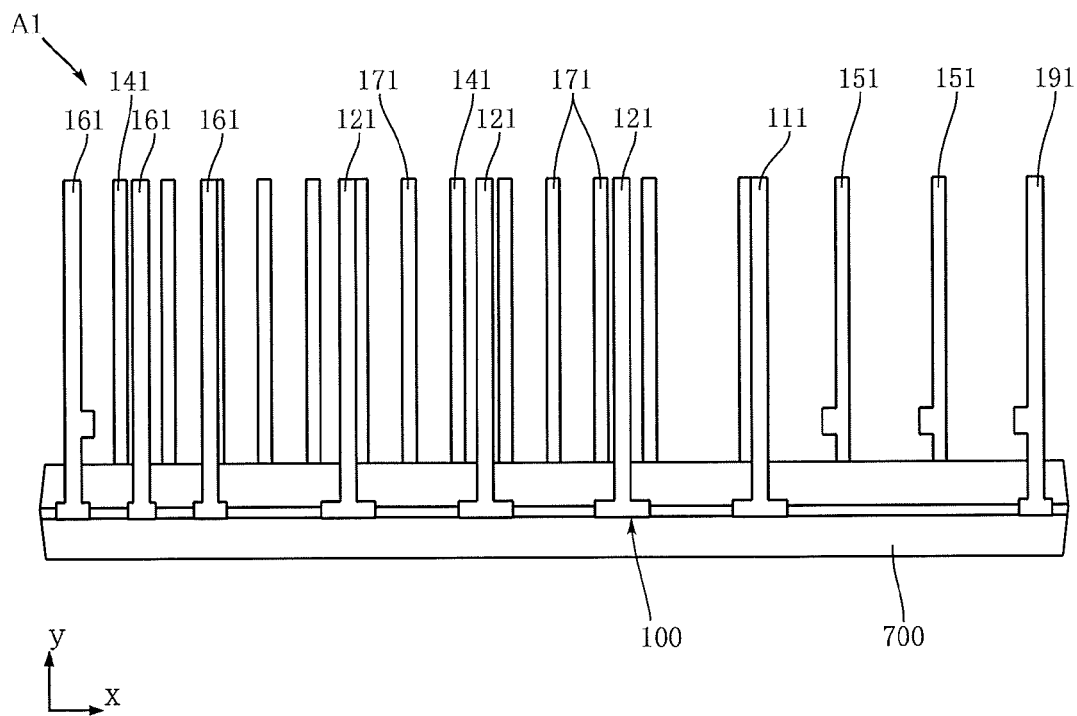
FIG. 3 is a front view showing the semiconductor device of FIG. 1.
Figure 4:
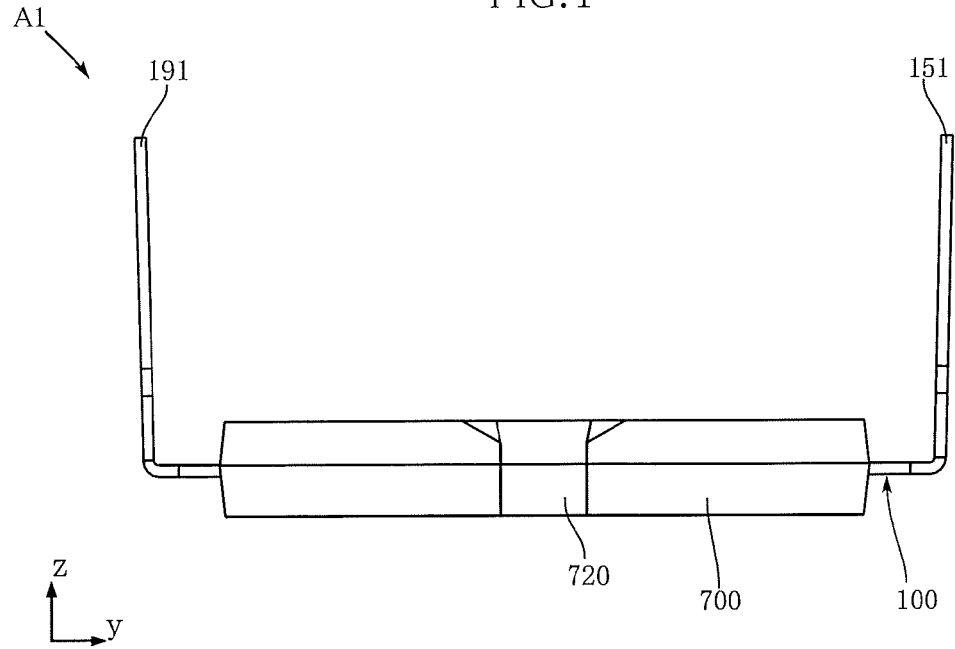
FIG. 4 is a side view showing the semiconductor device of FIG. 1.
Figure 5:
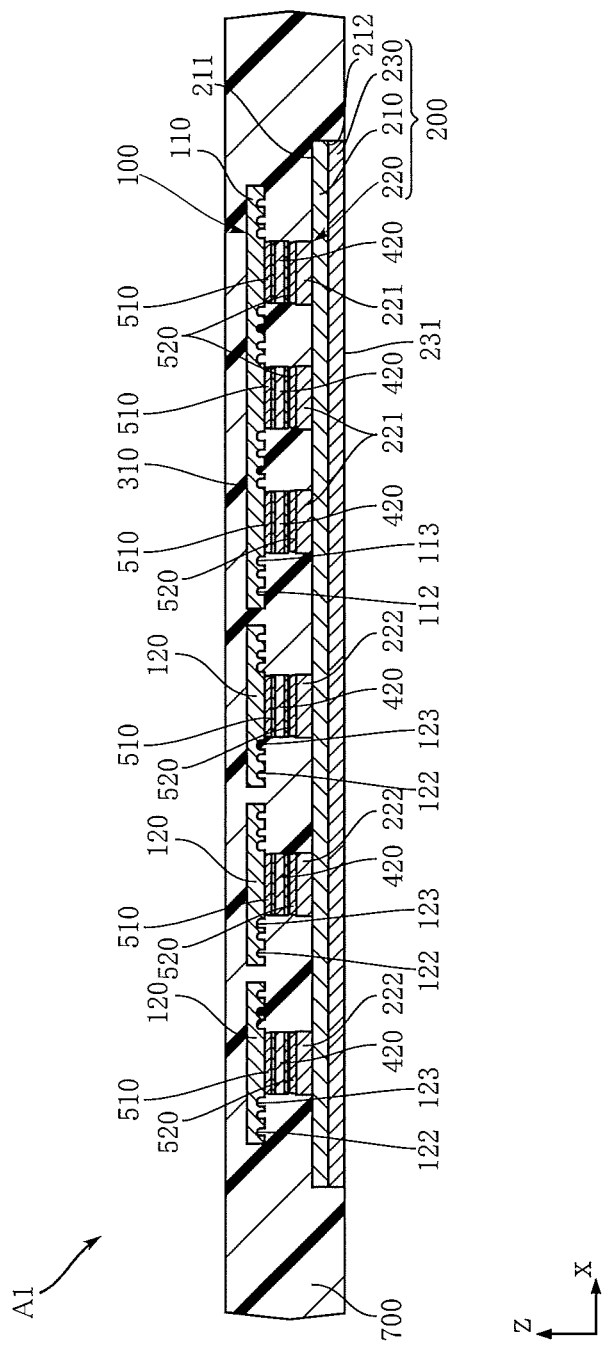
FIG. 5 is a cross-sectional view taken along line V-V in FIG. 2.
Figure 6:
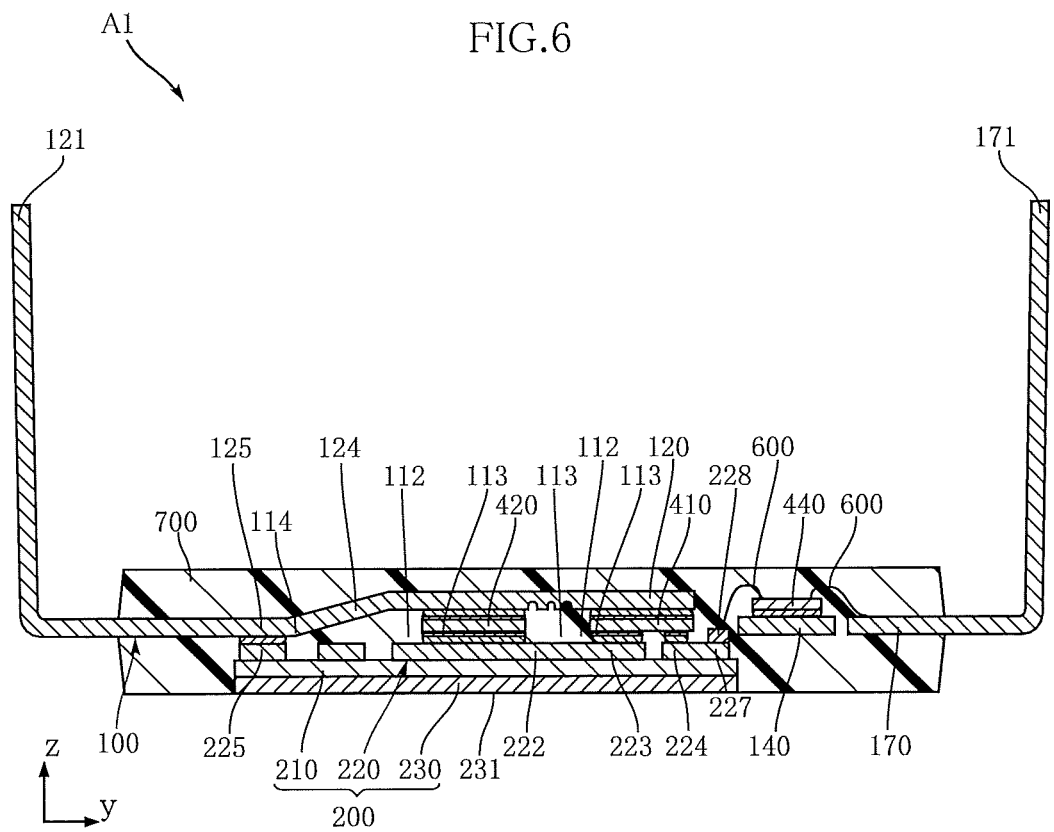
FIG. 6 is a cross-sectional view taken along line VI-VI in FIG. 2.

FIGS. 1 and 2 are plan views of the semiconductor device A1. In FIG. 2, the sealing resin member 700 is shown by the two-dot chain lines. FIG. 3 is a front view of the semiconductor device A1, and FIG. 4 is a side view of the semiconductor device A1. FIG. 5 is a cross-sectional view taken along line V-V in FIG. 2, where terminals to be described later are omitted for convenience of understanding. FIG. 6 is a cross-sectional view taken along line VI-VI in FIG. 2. Note that, in the cross-sectional views to be referred to in the following description, the wires 600 are partly omitted for convenience of understanding.

The substrate 200 includes conductive paths electrically connected to the semiconductor elements 410 and the semiconductor elements 420 to supply an operating current to these semiconductor elements. The substrate 200 also supports the semiconductor elements 410 and 420. The substrate 200 in this embodiment has a base 210, a conductive plate 220, and a heat dissipation plate 230.

The base 210 is made of an insulating material and, in this embodiment, configured as a plate member. An example of the insulating material is ceramic. Alternatively, the base 210 may be formed of a resin having a comparatively high thermal conductivity. Examples of the ceramic include alumina, SiN, and SiC. In this embodiment, a case of forming the base 210 of alumina will be described as an example.

The base 210 is rectangular as viewed from above, and has a principal surface 211 and a back surface 212 on opposite sides in the thickness direction (z direction). The thickness of the base 210 is about 0.3 to 0.4 mm, for example. As shown in FIG. 2, the base 210 is large enough to underlie all of the plurality of semiconductor elements 410 and the plurality of semiconductor elements 420 as viewed from above.

The conductive plate 220 constitutes conductive paths that feed an operating current through the semiconductor elements 410 and 420. The conductive plate 220 is patterned to form predetermined conductive paths. Note that the conductive plate 220 is only required to have a predetermined thickness, for example, to constitute conductive paths that can feed a sufficient magnitude of current, and not necessarily required to be a plate member (or a shaped one of a plate member). Under this precondition, in this embodiment, a conductive member that is different from a wire is referred to as the "conductive plate."

The conductive plate 220 is laminated to the principal surface 211 of the base 210. In this embodiment, the conductive plate 220 is directly bonded to the base 210. The conductive plate 220 is preferably eutectic bonded to the base 210 by direct copper bonding. The conductive plate 220 is made of a metal such as Cu, Ni, and Fe, for example. In this embodiment, a case of the conductive plate 220 made of Cu will be described as an example. The thickness of the conductive plate 220 is about 0.3 to 0.4 mm, for example.

The thickness of the conductive plate 220 may be equal to, or larger than, the thickness of the base 210.

Figure 9:
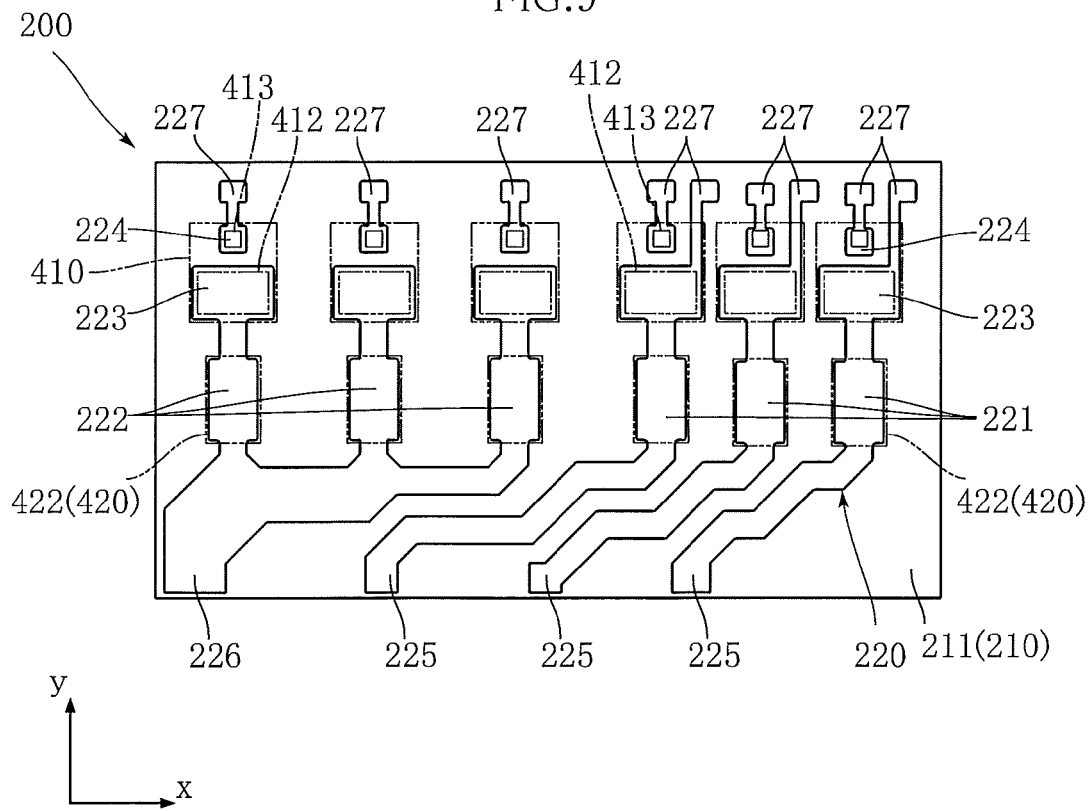
FIG. 9 is a plan view showing a substrate of the semiconductor device of FIG. 1.

FIG. 9 is a plan view showing the substrate 200. As shown in FIG. 9, the conductive plate 220 has a plurality of islands 221 and 222, a plurality of pads 223 and 224, a plurality of conductive portions 225 and 226, and a plurality of extensions 227. Note that, as used herein, the "island" refers to a part having a size almost coinciding with the entire semiconductor element as viewed from above, and the "pad" refers to a part having a size almost coinciding with an electrode that is part of the semiconductor element as viewed from above (i.e., clearly smaller than the entire semiconductor element).

The plurality of islands 221 are arranged in a row in the x direction on a portion of the base 210 closer to the right edge. Each of the islands 221, having a rectangular shape, is conductively connected to one corresponding semiconductor element 420. The plurality of islands 222 are arranged in a row in the x direction on a portion of the base 210 closer to the left edge. Each of the islands 222, having a rectangular shape, is conductively connected to one corresponding semiconductor element 420.

The plurality of pads 223 are conductively connected to their corresponding semiconductor elements 410. Each of the pads 223 is placed offset in the y direction with respect to one corresponding island 221 or 222, and coupled to the island. In this embodiment, the pads 223 have a rectangular shape.

The plurality of pads 224 are conductively connected to their corresponding semiconductor elements 410. Each of the pads 224 is placed offset in the y direction with respect to one corresponding pad 223, and located opposite to the island 221 or 222 with respect to the pad 223. The pad 224 is not coupled to the pad 223 (and in turn not to the island 221 or 222). In this embodiment, the pads 224 have a rectangular shape clearly smaller than the pads 223.

In FIG. 9, the plurality of conductive portions 225 are arranged on a portion of the base 210 closer to the lower edge in the y direction, and coupled to the plurality of islands 221. The conductive portions 225 are connected to part of the lead 100, thereby bringing the substrate 200 into conduction with the lead 100. Also, the conductive portion 226 is placed on a portion of the base 210 closer to the lower edge, and coupled to the plurality of islands 222. The conductive portion 226 is connected to part of the lead 100, thereby bringing the substrate 200 into conduction with the lead 100.

Figure 8:
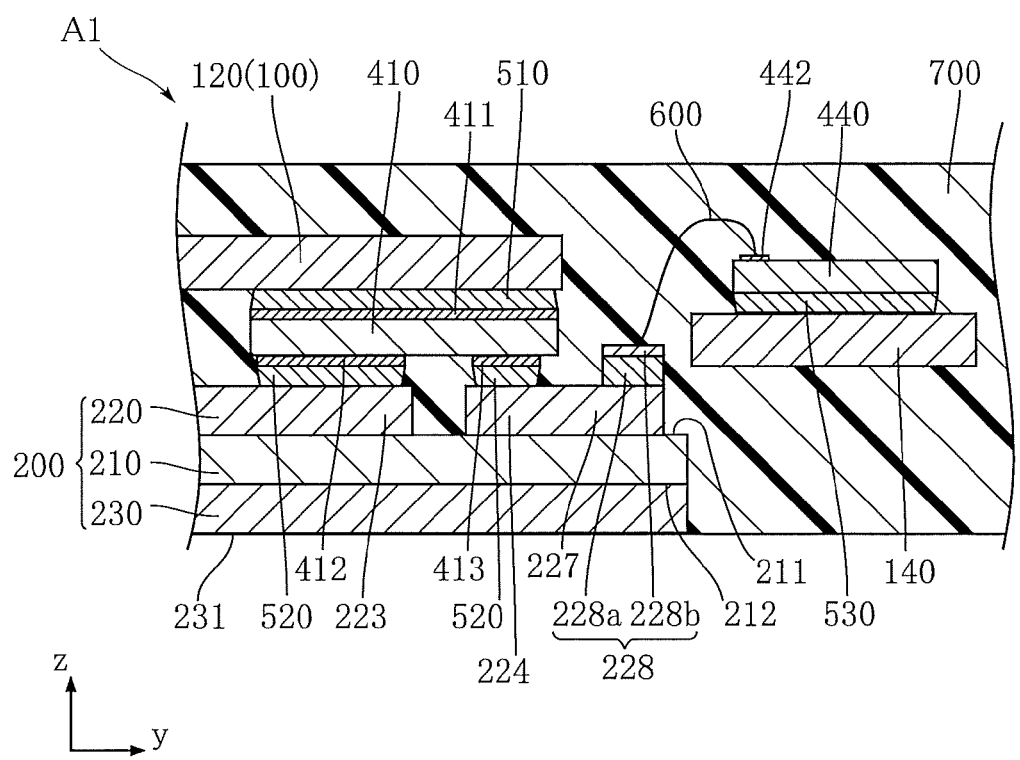
FIG. 8 is a cross-sectional view showing a main part of the semiconductor device of FIG. 1.

The plurality of extensions 227 protrude from the semiconductor elements 410 as viewed from above. Each of the extensions 227 is a portion to which a wire 600 conductively connected to the drive IC 430 or 440 is bonded. As shown in FIG. 8, a bonding chip 228 is provided on a tip portion of the extension 227. The bonding chip 228 is provided for facilitating and ensuring the bonding of the wire 600. The bonding chip 228 in this embodiment has a lower layer 228a and an upper layer 228b. The lower layer 228a is made of Cu, for example, and is about 100 µm thick, for example. The upper layer 228b is made of Ag, for example, and is about 10 µm thick, for example. The bonding chip 228 has a rectangular shape as viewed from above having a length of each side of about 1 mm or less. The bonding chips 228 can be mounted on the extensions 227 of the conductive plate 220 together with the semiconductor elements 410 and the semiconductor elements 420 in a process of mounting the semiconductor elements 410 and 420 on the substrate 200, for example.

The heat dissipation plate 230 is laminated to the back surface 212 of the base 210. The heat dissipation plate 230 plays a role of dissipating heat emanating from the semiconductor elements 410 and 420. The heat dissipation plate 230 is made of metal such as Cu, Fe, and Ni like the conductive plate 220, for example. In this embodiment, a case of the heat dissipation plate 230 made of Cu will be described as an example. The thickness of the heat dissipation plate 230 is similar to that of the conductive plate 220, i.e., about 0.3 to 0.4 mm, for example. The heat dissipation plate 230 may just be bonded to the base 210, but preferably be eutectic bonded to the base 210 by direct copper bonding.

As is understood from FIGS. 5 and 6, in this embodiment, the heat dissipation plate 230 is provided to cover the entirety of the back surface 212 of the base 210. Also, the heat dissipation plate 230 has an exposed surface 231. The exposed surface 231, which is the surface opposite to the base 210, is exposed from the sealing resin member 700. As shown in FIG. 6, the exposed surface 231 is flush with the bottom surface of the sealing resin member 700.

The lead 100 constitutes conductive paths to the plurality of semiconductor elements 410 and 420 and the drive ICs 430 and 440. In this embodiment, the lead 100 has islands 110, 120, 130, 140, and 150, pads 170 and 180, and terminals 111 121, 141, 151, 161, 171, 181, and 191. The lead 100 is made of metal, and, in this embodiment, made of Cu. The thickness of the lead 100 is about 0.42 mm, for example. The lead 100 is formed by performing cutting work, such as stamping, and bending work for a metal plate material, for example.

The island 110 is a part electrically connected to a plurality of semiconductor elements 410 and 420. The islands 120 are parts electrically connected to semiconductor elements 410 and 420. The island 130 is a part on which the drive IC 430 is mounted, and the island 140 is apart on which the drive IC 440 is mounted. The islands 150 are parts on which the passive components 490 are mounted. In this embodiment, one island 110 and three islands 120 lie side by side in the x direction, and the island 130 and the island 140 lie side by side in the x direction. The islands 110 and 120 and the islands 130 and 140 lie side by side in the y direction. Three islands 150 are arranged at positions adjacent to the island 130 in the y direction.

Figure 10:
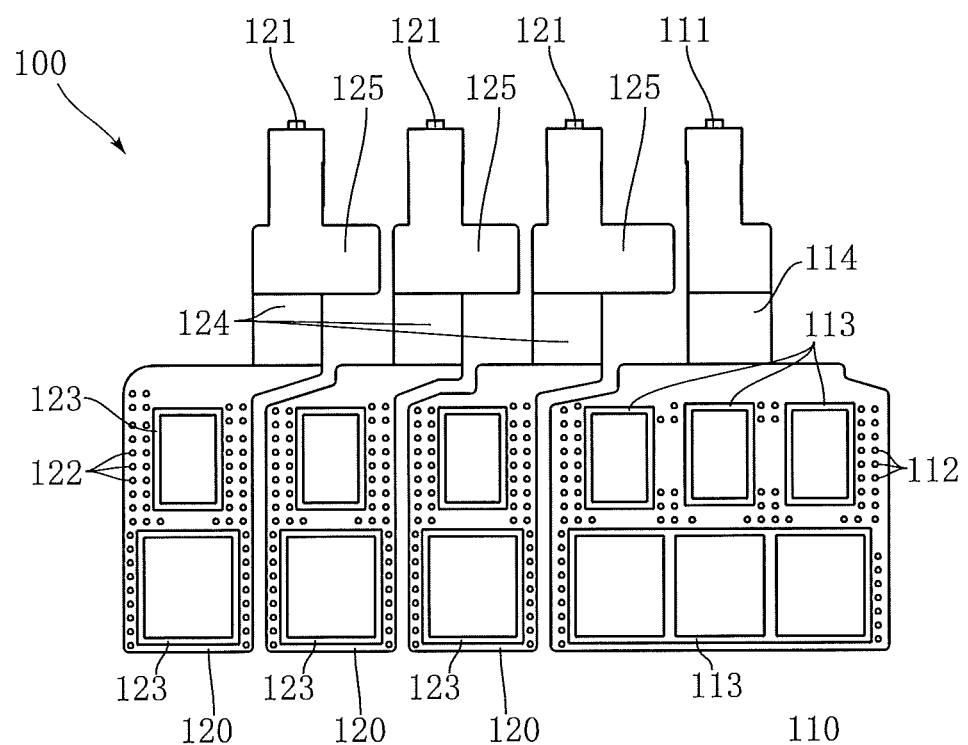
FIG. 10 is a bottom view of a main part showing a lead of the semiconductor device of FIG. 1.

FIG. 10 is a bottom view showing part of the lead 100. The island 110 has a roughly rectangular shape, to which a plurality of semiconductor elements 410 and 420 are electrically connected. In this embodiment, three semiconductor elements 410 and three semiconductor elements 420 are electrically connected to the island 110. As shown in FIG. 2, the three semiconductor elements 410 lie side by side in the x direction, and the three semiconductor elements 420 lie side by side in the x direction. The line of the three semiconductor elements 410 and the line of the three semiconductor elements 420 are arranged in parallel and apart in the y direction.

As shown in FIG. 10, a plurality of recesses 112 and a plurality of grooves 113 are formed on the island 110. The plurality of recesses 112 are open on the side of the island 110 on which the semiconductor elements 410 and 420 are placed. In this embodiment, the recesses 112 are circular in section, but the shape of the recesses is not limited to this. The plurality of recesses 112 are formed in regions of the island 110 other than the grooves 113 and regions surrounded by the grooves 113. In this embodiment, also, the plurality of recesses 112 are arranged in a grid pattern in the x and y directions.

The grooves 113 are formed to surround the semiconductor elements 410 or 420, and open on the side of the island 110 on which the semiconductors 410 and 420 are formed. The lower groove 113 as viewed in FIG. 10 has a rectangular outer frame and two parts extending in the y direction to divide the outer frame. With such a shape, three regions surrounded by the groove 113 are formed. The semiconductor elements 410 are independently placed in these regions. Each of the three upper grooves 113 as viewed in FIG. 10 is in the shape of a rectangle, and one semiconductor element 420 is placed in a region surrounded by the groove 113. While it is preferable that each groove be continuous as a whole, the shape is not limited to this. For example, a plurality of parts may be placed discretely.

As shown in FIG. 10, each of the islands 120 has a roughly rectangular shape elongated in the y direction, and is electrically connected to semiconductor elements 410 and 420. In this embodiment, one semiconductor element 410 and one semiconductor element 420 are electrically connected to the island 120. As shown in FIG. 2, the semiconductor elements 410 and 420 lie side by side in the y direction.

As shown in FIG. 10, a plurality of recesses 122 and a plurality of grooves 123 are formed on the island 120. The plurality of recesses 122 are open on the side of the island 120 on which the semiconductor elements 410 and 420 are placed. In this embodiment, the recesses 122 are circular in section, but the shape of the recesses is not limited to this. The plurality of recesses 122 are formed in regions of the island 120 other than the grooves 123 and regions surrounded by the grooves 123. In this embodiment, also, the plurality of recesses 122 are arranged in a grid pattern in the x and y directions.

The grooves 123 are formed to surround the semiconductor elements 410 or 420, and open on the side of the island 120 on which the semiconductor elements 410 and 420 are mounted. The lower groove 123 as viewed in FIG. 10 is in the shape of a rectangle, and the semiconductor element 410 is placed in a region surrounded by the groove 123. The upper groove 123 as viewed in FIG. 10 is in the shape of a rectangle, and the semiconductor element 420 is placed in a region surrounded by the groove 123. While it is preferable that each groove be continuous as a whole, the shape is not limited to this. For example, a plurality of parts may be placed discretely.

As shown in FIG. 2, the island 130 is placed adjacent to the island 110 in the y direction, and has a roughly rectangular shape elongated in the x direction. The drive IC 430 is mounted on the island 130. The drive IC 430, having a rectangular shape elongated in the x direction, corresponds in the longitudinal direction with the island 130.

A plurality of recesses 132 are formed on the island 130. The plurality of recesses 132 are open on the side of the island 130 on which the drive IC 430 is placed. In this embodiment, the recesses 132 are circular in section, but the shape of the recesses is not limited to this. The plurality of recesses 132 are mainly formed in a region of the island 130 avoiding the drive IC 430. The recesses 132 may also be formed at positions overlapping the drive IC 430 within the bounds of not causing the drive IC 430 to come off, etc. In this embodiment, the plurality of recesses 132 are arranged in a grid pattern in the x and y directions.

The island 140 is placed adjacent to the island 120 in the y direction, and has a roughly rectangular shape elongated in the x direction. The drive IC 440 is mounted on the island 140. The drive IC 440, having a rectangular shape elongated in the x direction, corresponds in the longitudinal direction with the island 140.

A plurality of recesses 142 are formed on the island 140. The plurality of recesses 142 are open on the side of the island 140 on which the drive IC 440 is placed. In this embodiment, the recesses 142 are circular in section, but the shape of the recesses is not limited to this. The plurality of recesses 142 are mainly formed in a region of the island 140 avoiding the drive IC 440. The recesses 142 may also be formed at positions overlapping the drive IC 440 within the bounds of not causing the drive IC 440 to come off, etc. In this embodiment, the plurality of recesses 142 are arranged in a grid pattern in the x and y directions. Also, a plurality of recesses 142 are also formed on a roughly triangular portion of the island 140.

The three islands 150 are placed at positions adjacent to the island 130 in the y direction, and lie side by side in the x direction. The islands 150 are small compared with the islands 110, 120, 130, and 140. The passive components 490 are mounted on the islands 150. A plurality of recesses 152 are formed on each of the islands 150. The recesses 152 are open on the side of the island 150 on which the passive component 490 is placed, at positions avoiding the passive component 490. In this embodiment, the plurality of recesses 152 are arranged in a grid pattern in the x and y directions. Also, the islands 150 have an arc-shaped cut corresponding to a groove 710 of the sealing resin member 700 to be described later.

The pads 170 and 180 are parts that are conductively connected to the drive IC 430 or 440 via wires 600.

The plurality of pads 170 are placed at positions adjacent to the islands 130 and 140. Each of the pads 170 has an elongated, roughly rectangular shape and, more specifically, has a narrow strip portion closer to the tip. A wire 600 is bonded to the pad 170.

The pad 180 is placed at a left-end position as viewed in FIG. 2. A wire 600 is bonded to the pad 180. The pad 180, having a roughly triangular shape, has a plurality of recesses 182. The recesses 182 are open on the side of the pad 180 on which the wire 600 is bonded, and formed at positions avoiding the wire 600. In this embodiment, the plurality of recesses 182 are arranged in a grid pattern in the x and y directions.

The above-described recesses 112, 122, 132, 142, 152, and 182 and the grooves 113 and 123 can be formed by etching in a process of forming the lead 100, for example. Alternatively, they can be formed by providing a plurality of protrusions on a die used for the cutting work or the bending work for forming the lead 100.

As is understood from FIGS. 2, 6, and 10, the lead 100 has curved portions 114 and 124. The curved portion 114 is coupled to the island 110, and curves so that a portion thereof apart from the island 110 is at a lower position in the z direction in FIG. 6. Each of the curved portions 124 is coupled to the corresponding island 120, and curves so that a portion thereof apart from the island 120 is at a lower position in the z direction.

A plurality of conductive portions 125 are parts for bringing the lead 100 into conduction with the substrate 200. As shown in FIGS. 2 and 6, each of the conductive portions 125 coincides with the corresponding conductive portions 225 of the conductive plate 220 of the substrate 200 as viewed from above. With the curved portion 124 provided for the lead 100, the conductive portion 125 is closer to the conductive plate 220 in the z direction than the island 120 is. The conductive portion 125 is bonded to the corresponding conductive portion 225 of the conductive plate 220 via a conductive bonding material. Examples of the conductive bonding material include Ag paste and solder.

A conductive portion 165 coincides with the conductive portion 226 of the conductive plate 220 as viewed from above. Like the conductive portions 125, the conductive portion 165 is bonded to the conductive portion 226 via the conductive bonding material.

The terminals 111, 121, 141, 151, 161, 171, 181, and 191 protrude from the sealing resin member 700. Each of the terminals 111, 121, 141, 151, 161, 171, 181, and 191 has a bent portion bent at an angle close to 90°, and has an end pointing upward in the z direction. The terminals 111, 121, 141, 151, 161, 171, 181, and 191 are used for mounting the semiconductor device A1 on a circuit board, etc., for example.

The terminal 111 is coupled to the curved portion 114 and conductively connected to the island 110. The three terminals 121 are coupled to the curved portions 124 and conductively connected to the islands 120. The two terminals 141 are coupled to the island 140. The three terminals 151 are coupled to the three islands 150. The three terminals 161 are coupled to the conductive portion 165. The plurality of terminals 171 are coupled to the plurality of pads 170. The terminal 181 is coupled to the pad 180.

In this embodiment, all the spacings of the terminals 111, 121, 141, 151, 161, 171, 181, and 191 are not equal to one another. For example, as for the spacings of the terminals 141, 151, 171, and 181 arranged on the same side in the y direction, while the two terminals 141, the plurality of terminals 171, and the terminal 181 are arranged at roughly equal spacings in the x direction, the spacings between the three terminals 151 and the terminal 171 adjacent to the terminals 151 are clearly large. Located between these three terminals 151 and adjacent terminal 171 having large spacings, are the grooves 710 of the sealing resin member 700 to be described later and also the arc-shaped cuts of the islands 150 described above.

The terminal 191 is provided separately at an end in the x direction. In this embodiment, the terminal 191 is not conductively connected to any of the islands 110, 120, 130, and 140 and the semiconductor elements 410, 420, 430, and 440.

As for the spacings of the terminals 111, 121, and 161 arranged on the same side in the y direction, while the three terminals 161 are arranged at comparatively narrow spacings, the spacings between the terminal 111, the three terminals 121, and the terminal 161 adjacent to these terminals are clearly large. The terminal 191 is placed at a further large spacing from the terminal 111.

The spacings of the terminals 111, 121, 141, 151, 161, 171, 181, and 191 described above are determined in consideration of the functions of these terminals. For example, when the semiconductor device A1 of this embodiment is configured as an IPM, the current controlled by the semiconductor device A1 will be a three-phase alternating current having U phase, V phase, and W phase, for example. The three terminals 121 will be assigned as U-phase, V-phase, and W-phase terminals. Also, a comparatively high voltage will be applied to the three terminals 151. For these reasons, relatively large spacings are secured between the terminals to which a relatively large current will flow or a high voltage will be applied.

The semiconductor elements 410 and 420 and the drive ICs 430 and 440 are function elements for making the semiconductor device A1 function as an IPM. In this embodiment, the semiconductor elements 410 and 420 are so-called power semiconductor elements. The power semiconductor elements are ones into/from which a three-phase alternating operating current that is a control object in an IPM, for example, flows, typified by an insulated-gate bipolar transistor (IGBT), a metal-oxide-semiconductor field-effect transistor (MOSFET), a fast recovery diode (FRD), etc. Also, such power semiconductor elements using SiC as a base may be used. In this embodiment, the semiconductor elements 410 are IGBTs, for example, and the semiconductor elements 420 are FRDs, for example.

Figure 11:
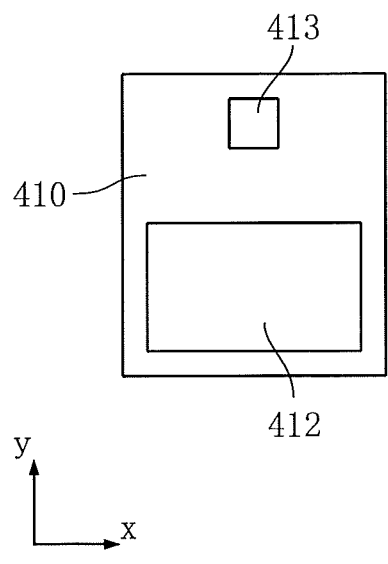
FIG. 11 is a plan view showing an example semiconductor element of the semiconductor device of FIG. 1.
Figure 12:
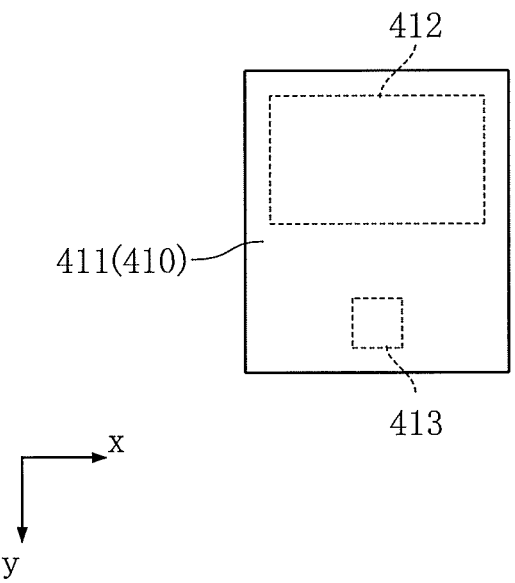
FIG. 12 is a bottom view showing the semiconductor element of FIG. 11.

FIG. 11 is a plan view showing the semiconductor element 410, and FIG. 12 is a bottom view showing the semiconductor element 410. As shown in these figures, the semiconductor element 410 has a first electrode 411 (FIG. 12) and two second electrodes 412 and 413.

The first electrode 411 is placed on the entirety of one surface of the semiconductor element 410, and the second electrodes 412 and 413 are placed on the other surface of the semiconductor element 410. As shown in FIG. 2, in this embodiment, six semiconductor elements 410 are provided. The first electrodes 411 of the three semiconductor elements 410 located to the right as viewed in FIG. 2 are bonded to the island 110 of the lead 100. The first electrodes 411 of the three semiconductor elements 410 located to the left as viewed in FIG. 2 are individually bonded to the islands 120. As shown in FIGS. 6 and 8, the first electrodes 411 are bonded by a bonding material 510.

The bonding material 510 is not specifically limited as far as it can perform conductive bonding. In this embodiment, solder is used as the bonding material 510. The solder as the bonding material 510 bonds the first electrodes 411 of the semiconductor elements 410 to the islands 110 and 120 by melting and then hardening. In this embodiment, since the first electrodes 411 are made of Au or Ag and the island 110 is made of Cu, the first electrodes 411 are greater in wettability toward the solder, i.e., the bonding material 510 in the molten state than the islands 110 and 120.

As shown in FIGS. 8 and 9, the second electrodes 412 are electrically connected to the pads 223 of the conductive plate 220 of the substrate 200 via a bonding material 520. The other second electrodes 413 are electrically connected to the pads 224 via the bonding material 520.

The bonding material 520 is not specifically limited as far as it can perform conductive bonding. In this embodiment, solder is used as the bonding material 520. The solder as the bonding material 520 bonds the second electrodes 412 and 413 of the semiconductor elements 410 to the pads 223 and 224 of the conductive plate 220 by melting and then hardening. In this embodiment, since the second electrodes 412 and 413 are made of Au or Ag and the pads 223 and 224 are made of Cu, the second electrodes 412 and 413 are greater in wettability toward the solder, i.e., the bonding material 520 in the molten state than the pads 223 and 224.

Figure 13:
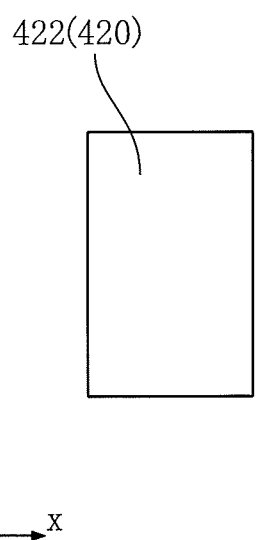
FIG. 13 is a plan view showing another example semiconductor element of the semiconductor device of FIG. 1.
Figure 14:
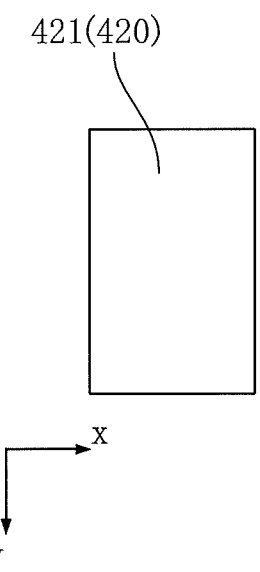
FIG. 14 is a bottom view showing the semiconductor element of FIG. 13.

FIG. 13 is a plan view showing the semiconductor element 420, and FIG. 14 is a bottom view showing the semiconductor element 420. As shown in these figures, the semiconductor element 420 has a first electrode 421 and a second electrode 422.

Figure 7:
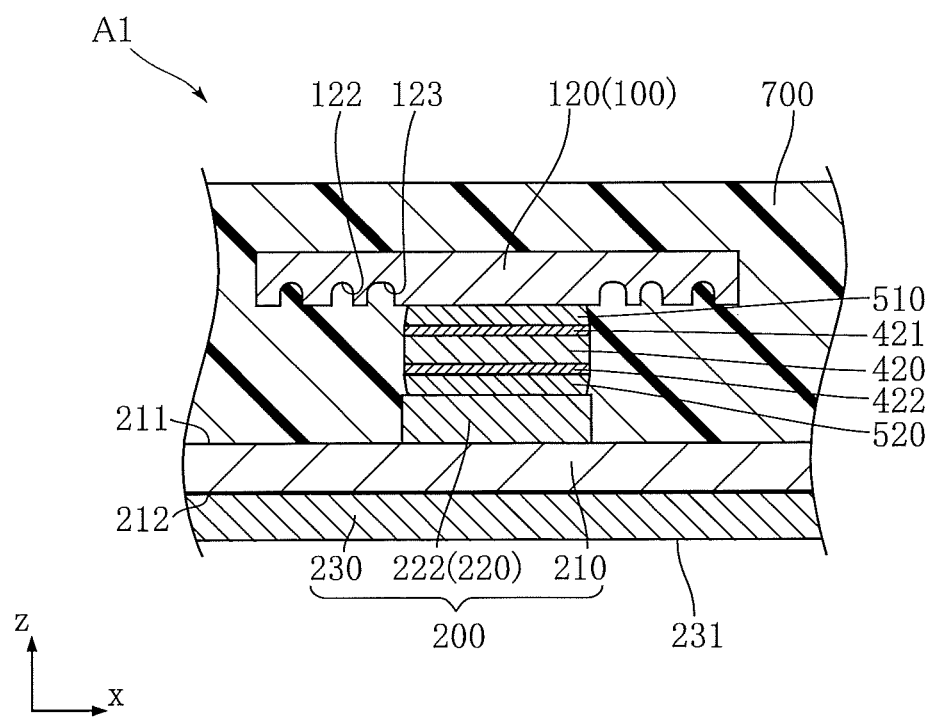
FIG. 7 is a cross-sectional view showing a main part of the semiconductor device of FIG. 1.

The first electrode 421 is formed on the entirety of one surface of the semiconductor element 420, and the second electrode 422 is formed on the entirety of the other surface of the semiconductor element 420. As shown in FIG. 2, in this embodiment, six semiconductor elements 420 are provided. The first electrodes 421 of the three semiconductor elements 420 located to the right in the x direction as viewed in FIG. 2 are bonded to the island 110 of the lead 100. The first electrodes 421 of the three semiconductor elements 420 located to the left in the x direction as viewed in FIG. 2 are individually bonded to the islands 120. As shown in FIGS. 5 and 7, the first electrodes 421 are bonded by the bonding material 510.

The bonding material 510 is not specifically limited as far as it can perform conductive bonding. In this embodiment, solder is used as the bonding material 510. The solder as the bonding material 510 bonds the first electrodes 421 of the semiconductor elements 420 to the islands 110 and 120 by melting and then hardening. In this embodiment, since the first electrodes 421 are made of Au or Ag and the islands 110 and 120 are made of Cu, the first electrodes 421 are greater in wettability toward the solder, i.e., the bonding material 510 in the molten state than the islands 110 and 120.

As shown in FIGS. 7 and 9, the second electrodes 422 are electrically connected to the islands 221 and the islands 222 of the conductive plate 220 of the substrate 200 via the bonding material 520.

The bonding material 520 is not specifically limited as far as it can perform conductive bonding. In this embodiment, solder is used as the bonding material 520. The solder as the bonding material 520 bonds the second electrodes 422 of the semiconductor elements 420 to the islands 221 and 222 of the conductive plate 220 by melting and then hardening. In this embodiment, since the second electrodes 422 are made of Au or Ag and the islands 221 and 222 are made of Cu, the second electrodes 422 are greater in wettability toward the solder, i.e., the bonding material 520 in the molten state than the islands 221 and 222.

Having the above relation in wettability toward the bonding material 510 that is solder, the solder (bonding material 510) in the molten state is more likely to adhere to the first electrodes 411 and 421 of the semiconductor elements 410 and 420 than to the islands 110 and 120 in a process of mounting the semiconductor elements 410 and 420. For this reason, in this embodiment, the contact area of the solder (bonding material 510) in the molten state with the first electrodes 411 and 421 of the semiconductor elements 410 and 420 is larger than that with the islands 110 and 120. Thus, as shown in FIGS. 7 and 8, the bonding material 510 has a shape of being large in a lower portion in the z direction. The bonding material 510 naturally lies inside the regions surrounded by the grooves 113 and 123.

Having the above relation in wettability toward the bonding material 520 that is solder, the solder (bonding material 520) in the molten state is more likely to adhere to the second electrodes 412, 413 and 422 of the semiconductor elements 410 and 420 than to the islands 221 and 222 and the pads 223 and 224 in the process of mounting the semiconductor elements 410 and 420. For this reason, in this embodiment, the contact area of the solder (bonding material 520) in the molten state with the second electrodes 412, 413, and 422 of the semiconductor elements 410 and 420 is larger than that with the islands 221 and 222 and the pads 223 and 224. Thus, as shown in FIGS. 7 and 8, the bonding material 520 has a shape of being large in an upper portion in the z direction. The bonding material 520 naturally lies inside the regions surrounded by the grooves 113 and 123.

In the process of mounting the semiconductor elements 410 and 420, also, solder paste that is to be the bonding material 510 is applied to the islands 110 and 120. At this time, the solder paste is applied to the regions of the islands 110 and 120 surrounded by the grooves 113 and 123. In particular, it is preferable to apply the solder paste with as much distance from the grooves 113 and 123 as possible.

In this embodiment, the drive ICs 430 and 440 are so-called control semiconductor elements. The control semiconductor elements are ones that fulfill the function of controlling the operation of the power semiconductor elements described above and through which a control current for this control flows. Examples of such elements include driver ICs. In this embodiment, both the drive ICs 430 and 440 are driver ICs: the drive IC 430 is a high-voltage side driver IC handling a comparatively high voltage current, and the drive IC 440 is a low-voltage side driver IC handling a comparatively low voltage current.

As shown in FIG. 2, the drive ICs 430 and 440 respectively have a plurality of upper electrodes 432 and 442. Wires 600 are bonded to the upper electrodes 432 and 442. As shown in FIG. 8, the drive IC 440 is bonded to the island 140 via a bonding material 530. The bonding material 530 is Ag paste, for example. Similarly, the drive IC 430 is bonded to the island 130 via the bonding material 530 made of Ag paste, for example.

The passive components 490 are single-function electronic components such as resistances, capacitors, and coils, and, in this embodiment, act on the current to the drive IC 430. The passive components 490 are bonded to the islands 150. Wires 600 are bonded to the top surfaces of the passive components 490 in the z direction.

The wires 600 constitute conductive paths to allow the drive ICs 430 and 440 and the passive components 490 to fulfill their predetermined functions. In this embodiment, the wires 600 are used for configuration of conductive paths through which a comparatively small current flows, are made of Au, for example, and have a diameter of about 38 μm, for example. Each of the wires 600 is bonded to either the upper electrode 432 of the drive IC 430 or the upper electrode 442 of the drive IC 440 at one end, and to any one of the islands 150 of the lead 100, the pads 170 and 180 of the lead 100, the bonding chips 228 of the substrate 200, and the passive components 490 at the other end.

Figure 15:
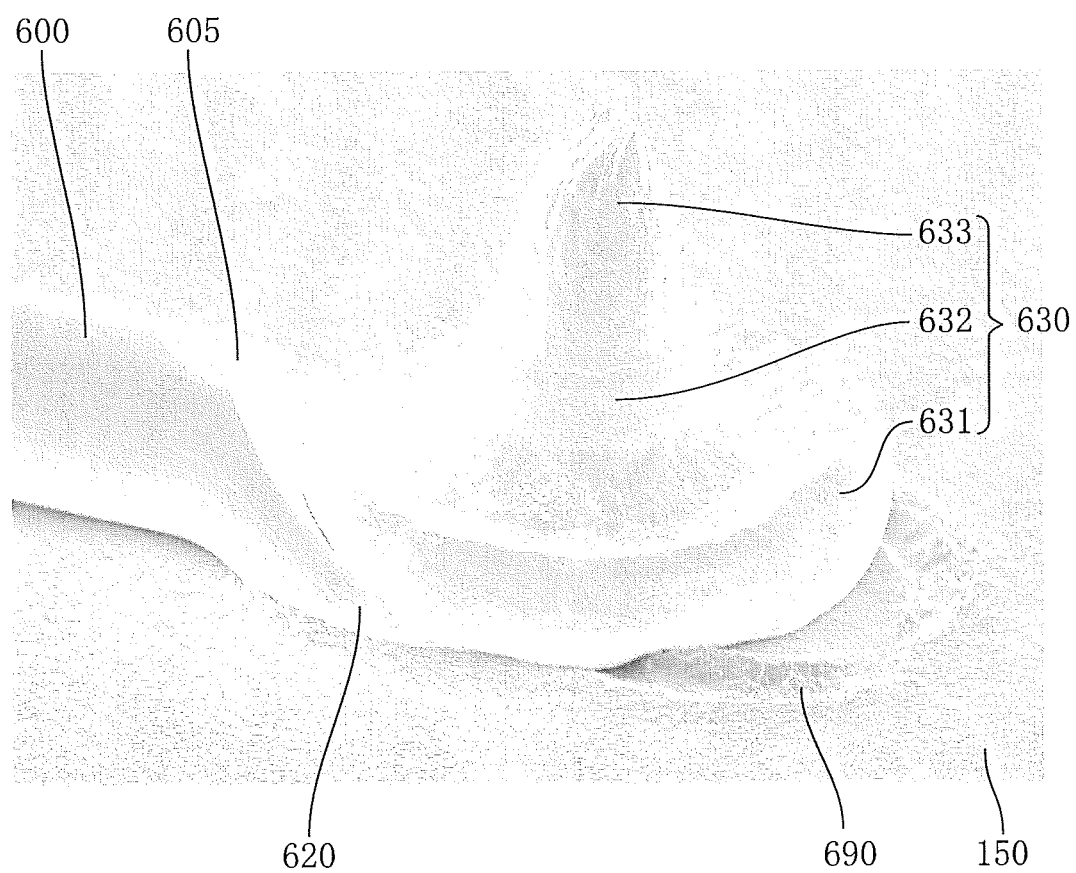
FIG. 15 is a photograph showing a main part of a wire of the semiconductor device of FIG. 1.

FIG. 15 is an enlarged photograph showing part of the wire 600, and FIGS. 16 to 24 show an example of a wire bonding method for forming the wire 600. As shown in FIG. 15, the wire 600 has a second bonding portion 620, a step portion 605, and a reinforced bonding portion 630. Also, as will be understood from FIG. 17, the wire 600 has a first bonding portion 610.

In the wire bonding method shown in FIGS. 16 to 24, the wire 600 connecting the upper electrode 432 of the drive IC 430 and one of the islands 150 as viewed in FIG. 2 is shown as an example. It should be noted that the wires 600 in this embodiment are formed in a wire bonding method similar to the illustrated method.

Figure 16:
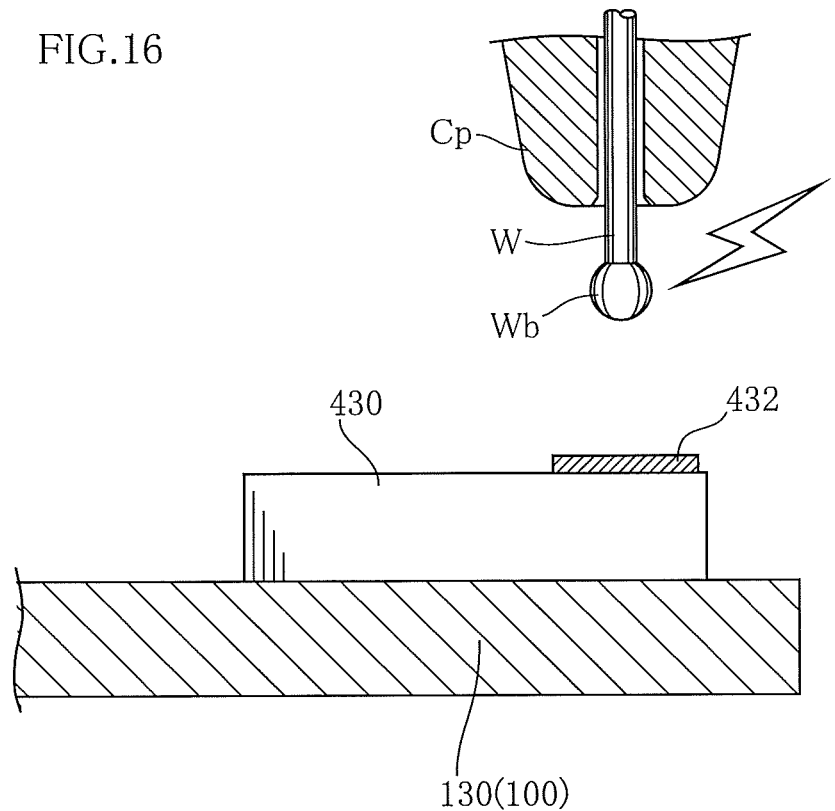

First, as shown in FIG. 16, a capillary Cp is prepared. The capillary Cp is in the shape of a tube having a through hole, and the tip (bottom end in FIG. 16) is smoothly curved. A wire W made of Au is fed out from the capillary Cp retractably. A spark, for example, is applied to the tip of the wire W fed out from the capillary Cp, to form a ball Wb.

Figure 17:
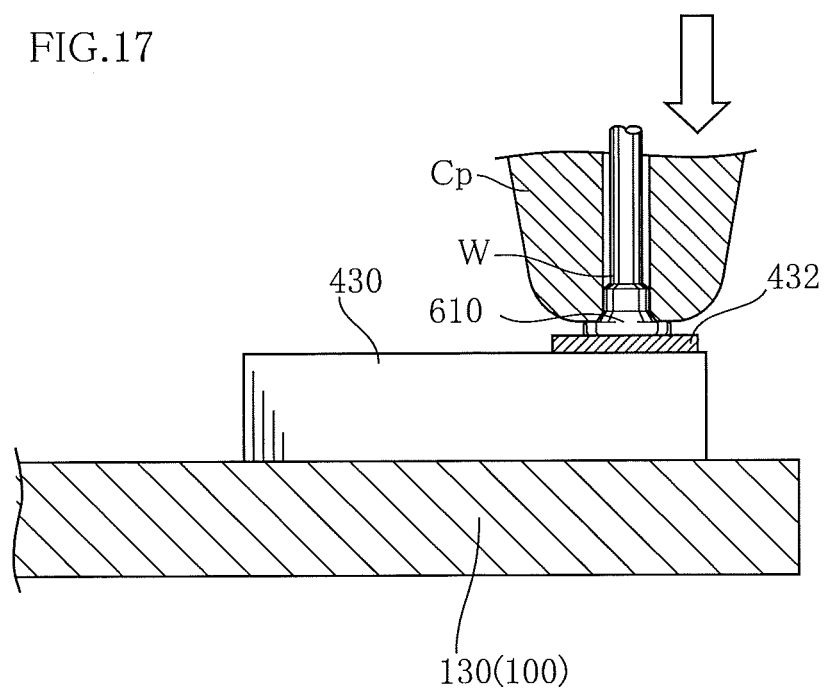

Subsequently, as shown in FIG. 17, the capillary Cp is lowered to press the ball Wb against the upper electrode 432 of the drive IC 430, whereby the ball Wb is crushed between the upper electrode 432 and the tip of the capillary Cp. The crushed ball Wb is to be the first bonding portion 610 that is a bonding part to the upper electrode 432.

Figure 18:
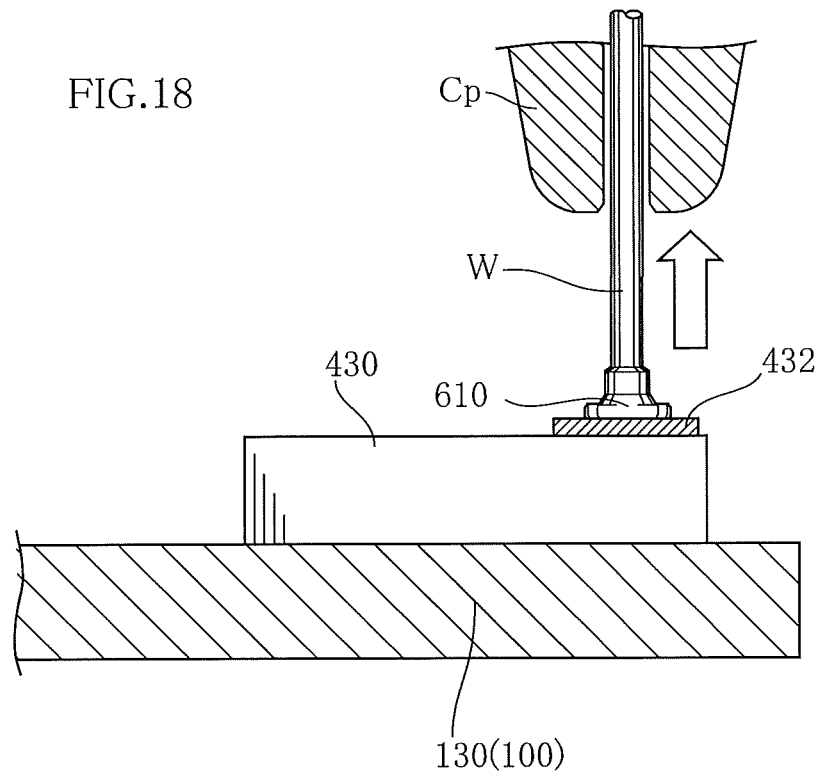
Figure 19:
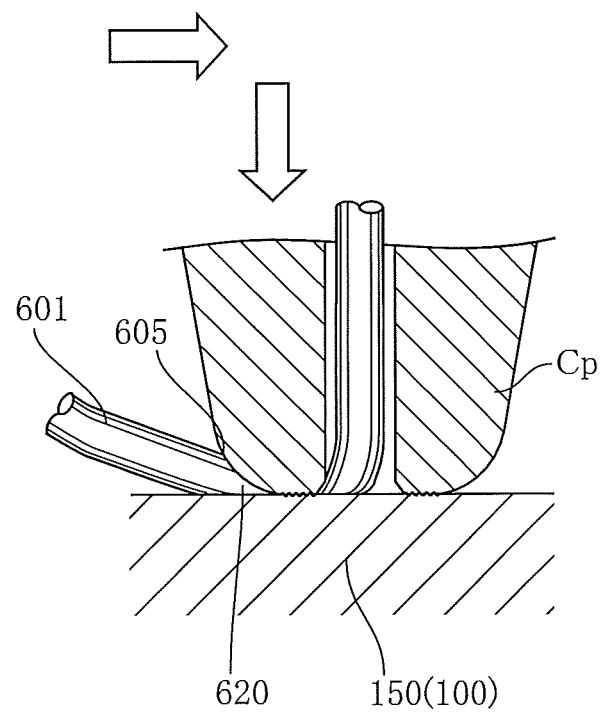

Thereafter, as shown in FIG. 18, the capillary Cp is raised while the wire W is being fed out. As shown in FIG. 19, the capillary Cp is moved to a position right above the island 150, and then lowered to press the tip of the capillary Cp against the island 150. By this pressing, the wire W is pinched between the tip of the capillary Cp and the island 150 and cut. By this cutting, a wire 601 bonded to the upper electrode 432 of the drive IC 430 and the island 150 is formed.

The portion of the wire 601 bonded to the island 150 is to be the second bonding portion 620. The second bonding portion 620 is a part of the wire W subjected to deformation with the tip of the capillary Cp. The wire 601 also has the step portion 605 at the boundary between a contact portion with the capillary Cp and a non-contact portion. While the portion of the wire 601 closer to the first bonding portion 610 with respect to the step portion 605 is circular in section, the second bonding portion 620 located closer to the tip from the step portion 605 as the boundary gradually becomes thin toward the tip.

Figure 20:
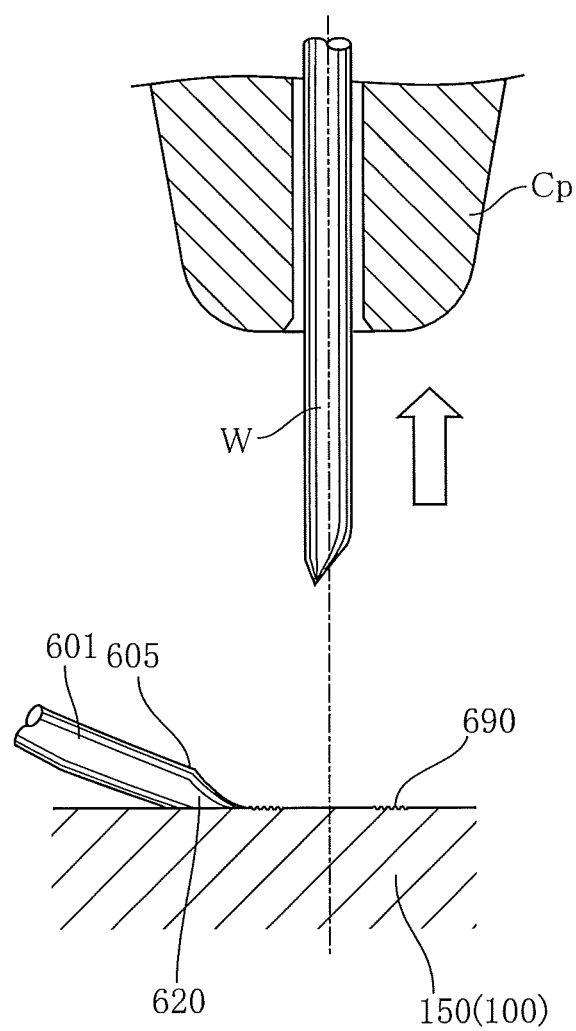

As shown in FIG. 20, the capillary Cp is then raised while feeding of the wire W is stopped. An annular mark 690 is formed on a part of the island 150 against which the capillary Cp is pressed in direct contact. The annular mark 690 has a shape corresponding to the shape of the tip of the tubular capillary Cp, which is ring-shaped, for example.

Figure 21:
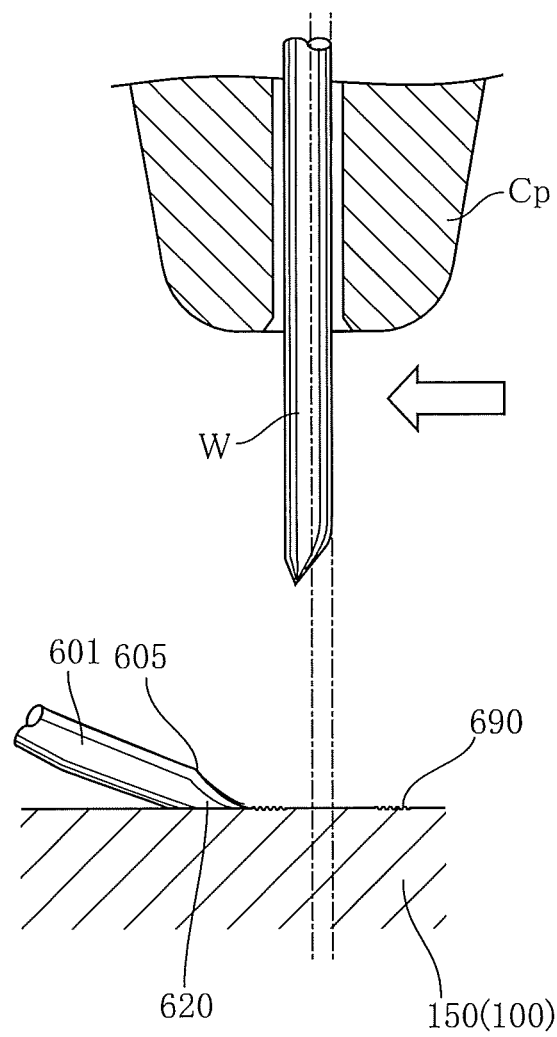

Subsequently, as shown in FIG. 21, the capillary Cp is slightly moved to the left. This movement is in the direction in which the center axis (the dashed-dotted line in FIG. 21) of the capillary Cp is shifted toward the second bonding portion 620. Thereafter, as shown in FIG. 22, a ball Wb is formed again at the tip of the wire W.

Figure 23:
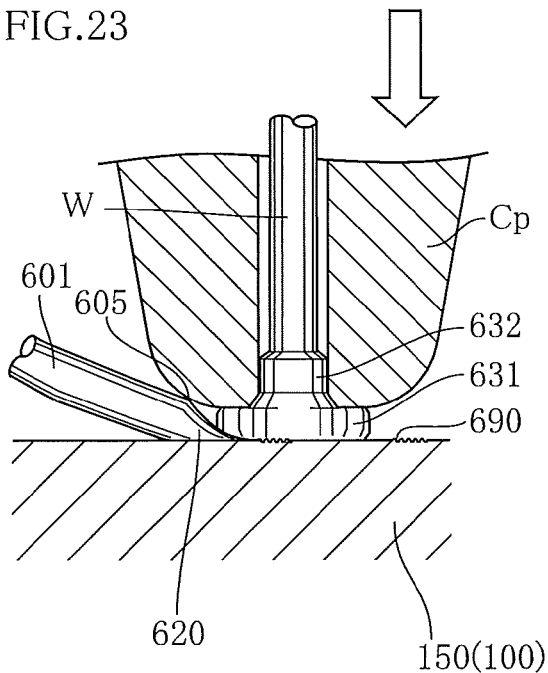

As shown in FIG. 23, the capillary Cp is then lowered, whereby the ball Wb is crushed between the island 150 and the tip of the capillary Cp. The crushed ball Wb is to constitute a disk portion 631 and a column portion 632. The disk portion 631 is a portion sandwiched and stretched between the tip of the capillary Cp and the island 150. The column portion 632 is a portion deformed along the through hole of the capillary Cp inside a tip portion of the through hole under high compressing force, and has a columnar shape smaller in diameter than the disk portion 631.

Figure 24:
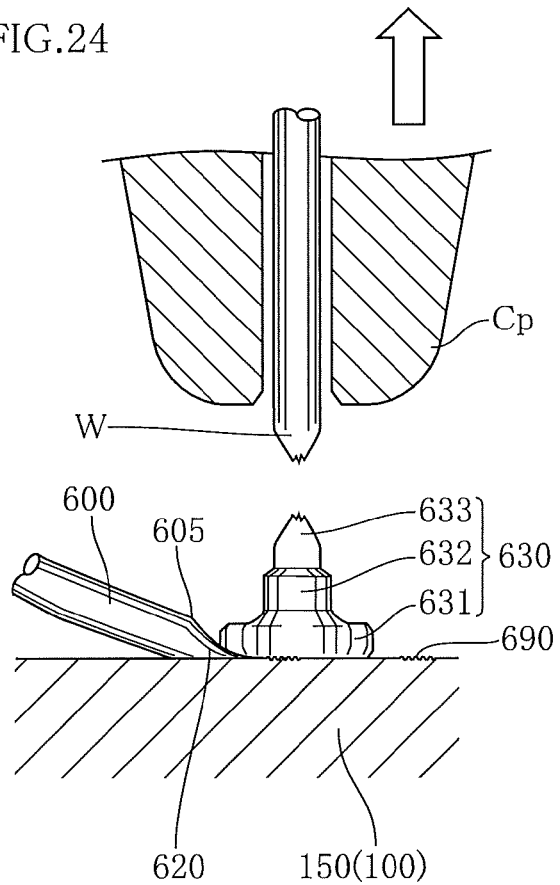

The capillary Cp is then raised as shown in FIG. 24, whereby the wire W is cut off, forming the reinforced bonding portion 630 having a spire portion 633 in addition to the disk portion 631 and the column portion 632 described above. The spire portion 633 is a portion left behind when the wire W is pulled apart, thereby having a shape of sticking upward. In this way, the wire 600 is completed.

In this embodiment, as shown in FIGS. 15 and 24, the reinforced bonding portion 630 overlaps at least part of the second bonding portion 620 and does not cover the step portion 605. Also, the reinforced bonding portion 630 does not cover a portion of the annular mark 690 located opposite to the second bonding portion 620. More specifically, the reinforced bonding portion 630 covers a part of at least a half of the annular mark 690 located closer to the second bonding portion 620.

Note that, in this embodiment, the reinforced bonding portion 630 is also formed for a plurality of wires 600 other than the wire 600 described above appropriately. The first bonding portions 610 of the plurality of wires 600 shown in FIG. 2 are bonded to either the upper electrode 432 of the drive IC 430 or the upper electrode 442 of the drive IC 440. By contrast, the second bonding portions 620 of these wires 600 are bonded to the islands 150 of the lead 100, the pads 170 and 180 of the lead 100, the bonding chips 228 of the substrate 200, and the passive components 490.

The sealing resin member 700 partly or entirely covers the lead 100, the semiconductor elements 410 and 420, the drive ICs 430 and 440, the passive components 490, and the wires 600. The sealing resin member 700 is made of black epoxy resin, for example.

As shown in FIG. 1, the sealing resin member 700 has four grooves 710 and two grooves 720. The four grooves 710 are dented in the y direction and extend in the z direction. The four grooves 710 are provided at a position between the three terminals 151 and the terminals 171 and at positions adjacent to the terminals 151. As shown in FIG. 2, the islands 150 have the arc-shaped cuts to correspond to the grooves 710. As described above, the spacings between the three terminals 151 are comparatively large.

The two grooves 720 are provided at both ends of the sealing resin member 700 in the x direction, are dented in the x direction, and extend in the z direction. The grooves 720 are used at the time of transport, mounting, etc. of the semiconductor device A1, for example.

As is understood from FIGS. 5 to 8, the sealing resin member 700 has entered the recesses 112, 122, 132, 142, 152, and 182 and the grooves 113 and 123 of the lead 100. Also, in this embodiment, the surface of the sealing resin member 700 facing downward in the z direction is flush with the exposed surface 231 of the heat dissipation plate 230 of the substrate 200.

Next, the function of the semiconductor device A1 will be described.

In this embodiment, the conductive paths for a current flowing through the semiconductor elements 410 and 420 can be constituted by the conductive plate 220 of the substrate 200. Therefore, a larger current can be fed through the semiconductor device A1 compared with the case of constituting the conductive paths using wires, for example. In particular, since the semiconductor elements 410 and 420 are power semiconductor elements, a current that drives motors, etc. controlled by the semiconductor device A1 flows through the conductive plate 220. Such a current (operating current) is generally required to be a large current. In such a use, the semiconductor device A1 is suitable for large-current implementation. Also, the conductive plate 220, which is made of metal (in particular, Cu), is advantageous in feeding a large current.

The substrate 200 has the base 210 laminated to the conductive plate 220. Therefore, in a process of manufacturing the semiconductor device A1, for example, the base 210 can stably support the conductive plate 220. Also, since the base 210 is made of ceramics in this embodiment, it is possible to sufficiently enhance the dielectric strength voltage between the conductive plate 220 conductively connected to the semiconductor elements 410 and 420 and a circuit board on which the semiconductor device A1 is mounted, etc. Moreover, the base 210 can swiftly transfer heat generated from the conductive plate 220 and the semiconductor elements 410 and 420.

The substrate 200 further has the heat dissipation plate 230. Therefore, the heat transferred to the base 210 can be swiftly dissipated. In particular, since the heat dissipation plate 230 is made of metal, the dissipation effect can be enhanced. Moreover, with the exposed surface 231 of the heat dissipation plate 230 exposed from the sealing resin member 700, heat dissipation to the outside of the semiconductor device A1 can be facilitated.

The thicknesses of the conductive plate 220 and the heat dissipation plate 230 are equal to or larger than that of the base 210. The thick conductive plate 220 permits further large current implementation of the conductive paths, and the thick heat dissipation plate 230 is advantageous in dissipating heat.

The lead 100 is conductively connected to the conductive plate 220 of the substrate 200 in its conductive portions 125 and 165, whereby the operating current fed through the semiconductor elements 410 and 420 can be fed to the lead 100 and the conductive plate 220 without intervention of wires, etc.

With the terminals 111, 121, and 161 provided for the lead 100, the operating current can be appropriately received from, and output to, the circuit board on which the semiconductor device A1 is mounted, etc.

Moreover, as shown in FIGS. 7 and 8, since the wettability of the second electrodes 412 and 422 of the semiconductor elements 410 and 420 toward the bonding material 520 in the molten state is greater than that of the conductive plate 220, the molten bonding material 520 exhibits a behavior as if extending along the second electrodes 412 and 422, reducing the contact areas with the conductive plate 220. As a result, the hardened bonding material 520 is comparatively small in the contact portions with the conductive plate 220, resulting in increasing the thickness of the bonding material 520. Thus, even if thermal stress acts on the bonding parts between the semiconductor elements 410 and 420 and the conductive plate 220, such thermal stress can be cushioned by the bonding material 520, preventing coming off of the semiconductor elements 410 and 420.

Similarly, since the wettability of the first electrodes 411 and 421 of the semiconductor elements 410 and 420 toward the bonding material 510 in the molten state is greater than that of the lead 100, the molten bonding material 510 exhibits a behavior as if extending along the first electrodes 411 and 421, reducing the contact areas with the lead 100. As a result, the hardened bonding material 510 is comparatively small in the contact portions with the lead 100, resulting in increasing the thickness of the bonding material 510. Thus, even if thermal stress acts on the bonding parts between the semiconductor elements 410 and 420 and the lead 100, such thermal stress can be cushioned by the bonding material 510, preventing coming off of the semiconductor elements 410 and 420.

Having the grooves 113 and 123 formed on the islands 110 and 120, the molten bonding material 510 can be prevented from unduly expanding to the surroundings. Even if the molten bonding material 510 comes closer to the grooves 113, the edges of the grooves 113 are expected to exert the effect of blocking the bonding material 510 from overrunning the grooves due to the action of surface tension, to confine the molten bonding material 510. Since the grooves 113 and 123 surround the entire circumferences of the semiconductor elements 410 and 420, expansion of the bonding material 510 can be prevented more suitably.

Also, in this embodiment, the plurality of recesses 112, 122, 132, 142, 152, and 182 are formed at appropriate positions of the lead 100. The sealing resin member 700 enters such recesses 112, 122, 132, 142, 152, and 182, whereby the bonding strength of the sealing resin member 700 to the lead 100 can be enhanced. Thus, the sealing resin member 700 can be prevented from coming off from the lead 100.

The portions of the islands 110 and 120 coinciding with the semiconductor elements 410 and 420 do not have the recesses 112 and 122 but are smooth. The semiconductor elements 410 and 420 can therefore be bonded via the bonding material 510 appropriately. Also, the plurality of recesses 112 and 122 are arranged on the islands 110 and 120 to surround the semiconductor elements 410 and 420. Thus, the sealing resin member 700 can be firmly bonded to the islands 110 and 120 surrounding the semiconductor elements 410 and 420. This is suitable for prevention of coming off of the sealing resin member 700, and thus generation of voids communicating with the semiconductor elements 410 and 420 due to such coming off can be blocked. Prevention of such voids is suitable for holding the insulating state of the semiconductor elements 410 and 420.

Also, in this embodiment, each wire 600 has the reinforced bonding portion 630 overlapping the second bonding portion 620. The reinforced bonding portion 630 is formed so that the step portion 605 where the diameter of the wire 600 sharply becomes small is intentionally exposed and conversely a thin portion of the second bonding portion 620 is covered without fail. Having such a configuration, it is possible to enhance the bonding strength of the comparatively thin second bonding portions 620 to the islands 150, the bonding chips 228, the passive components 490, and the pads 170 and 180 that are bonding objects, and thus prevent or reduce coming off of the wires 600.

As shown in FIG. 15, the reinforced bonding portion 630 does not cover a portion of the annular mark 690. The annular mark 690 is a mark of the capillary Cp pressed at the time of forming the second bonding portion 620. Providing the reinforced bonding portion 630 at a position where the annular mark 690 is partly exposed indicates that the reinforced bonding portion 630 is avoided from being unduly apart from the second bonding portion 620. This further ensures prevention of coming off of the second bonding portion 620. Also, providing the reinforced bonding portion 630 to cover a part of at least a half of the annular mark 690 indicates that the reinforced bonding portion 630 covers a large part of the second bonding portion 620. This is suitable for prevention of coming off of the second bonding portion 620.

Since the conductive plate 220 has the extensions 227, the wires 600 can be bonded appropriately to parts of the conductive plate 220 conductively connected to the second electrodes 413 of the semiconductor elements 410. With the bonding chips 228 provided on the tips of the extensions 227, the wires 600 can be bonded further strongly. Since the bonding chip 228 is comprised of the lower layer 228a made of Cu and the upper layer 228b made of Au, the bonding strength of the wires 600 made of Au, in particular, can be suitably enhanced.

Figure 25:
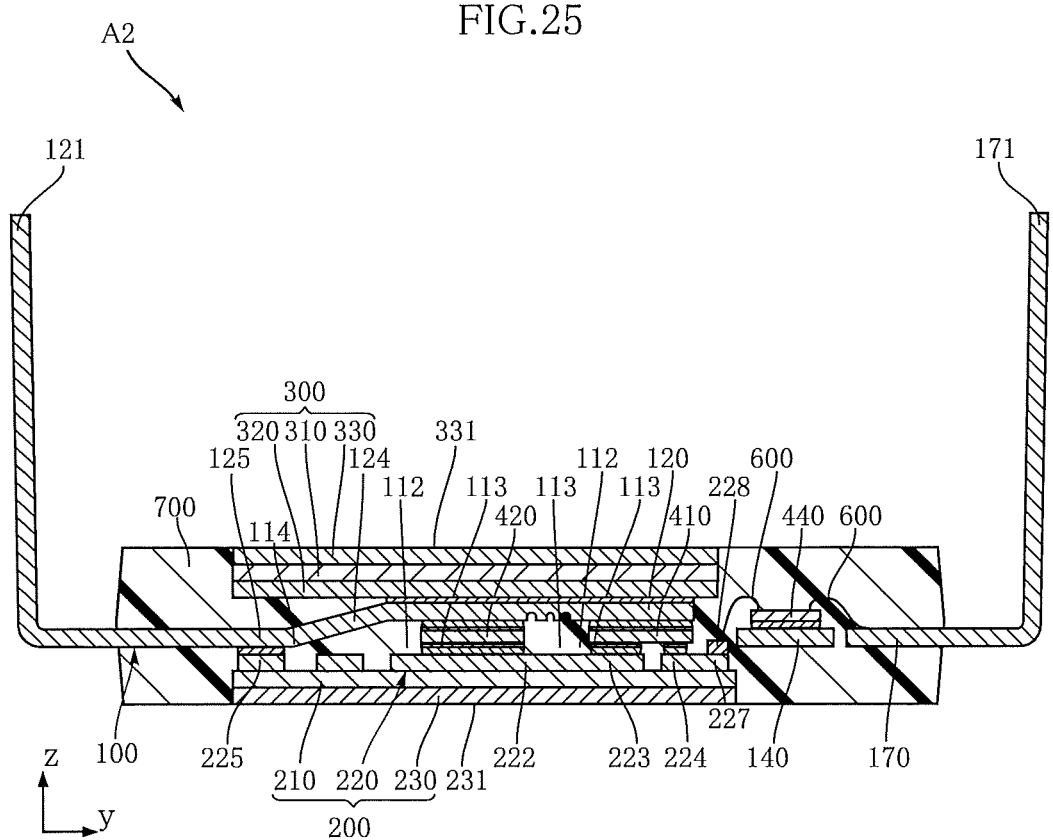
FIG. 25 is a cross-sectional view showing a semiconductor device according to a second embodiment of the invention.
Figure 26:
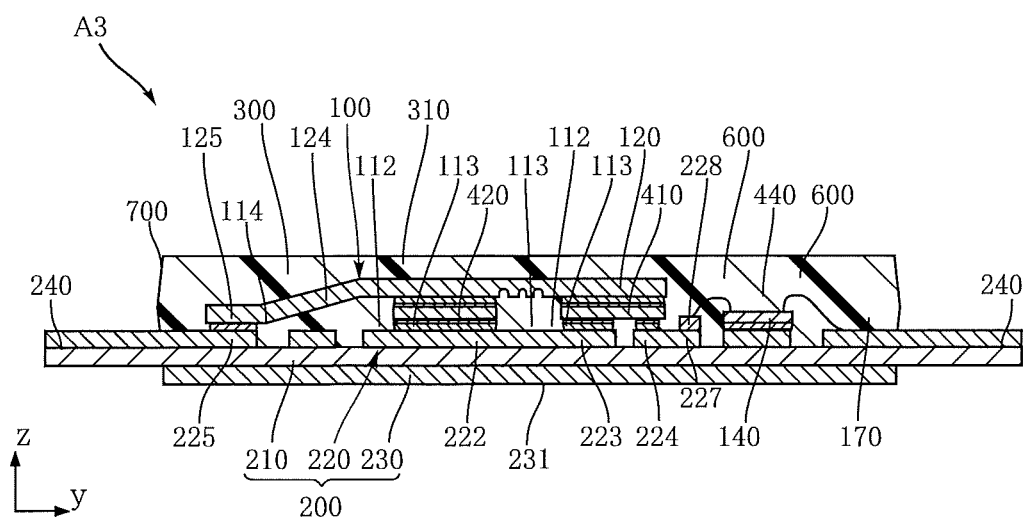
FIG. 26 is a cross-sectional view showing a semiconductor device according to a third embodiment of the invention.

FIGS. 25 and 26 show other embodiments of the invention. Note that, in these figures, identical or similar components to those in the above embodiment are denoted by the same reference characters.

FIG. 25 shows a semiconductor device according to the second embodiment of the invention. The semiconductor device A2 of this embodiment is different from the above-described embodiment in having a heat dissipation member 300. The heat dissipation member 300 is bonded to the lead 100 on the side opposite to the semiconductor elements 410 and 420. The bonding between the heat dissipation member 300 and the lead 100 may be made using the bonding material 510 and the bonding material 520, for example.

The heat dissipation member 300 has a base 310, a heat transfer plate 320, and a heat dissipation plate 300. The base 310, configured similar to the base 210 of the substrate 200, is made of ceramics such as alumina. The heat transfer plate 320 is provided on the side of the base 310 closer to the lead 100, and is made of metal such as Cu, like the conductive plate 220 of the substrate 200. The heat transfer plate 320 is however provided on the entirety of one surface of the base 310. The heat transfer plate 320 may just be bonded to the base 310, but preferably be eutectic bonded to the base 310 by direct copper bonding. The heat dissipation plate 330 is provided on the side of the base 310 opposite to the lead 100. The heat dissipation plate 330, configured similar to the heat dissipation plate 230 of the substrate 200, is made of metal such as Cu. The heat dissipation plate 330 is provided on the entirety of the other surface of the base 310. Also, the heat dissipation plate 330 has an exposed surface 331. The exposed surface 331 is exposed from the sealing resin member 700 and is flush with the sealing resin member 700.

In this embodiment, as in the first embodiment, a larger current can be fed through the semiconductor device A2. Also, with the provision of the heat dissipation member 300, heat dissipation from the semiconductor elements 410 and 420 can be facilitated. Moreover, with the heat dissipation member 300, the dielectric strength voltage of the semiconductor device A2 can be enhanced, and also the strength can be improved.

FIG. 26 shows a semiconductor device according to the third embodiment of the invention. The semiconductor device A3 of this embodiment is different from the above-described embodiments in that the substrate 200 has a terminal 240. The terminal 240 is a part of the substrate 200 protruding from the sealing resin member 700, and is comprised of part of the base 210 and part of the conductive plate 220. Such a terminal 240 is used as an electrically conductive portion at the time of mounting the semiconductor device A3 on a circuit board, etc., and may be used as a part mechanically supporting the semiconductor device A3.

The semiconductor device according to the invention is not limited to the embodiments described above, but the specific configurations of the components of the semiconductor device according to the invention can be design-changed in various ways.

The invention claimed is:

1. A semiconductor device comprising:
   at least one semiconductor element including a first electrode and a second electrode that are opposite to each other in a thickness direction;
   a substrate including an insulating base and a conductive plate, the insulating base including a first surface and a second surface that are opposite to each other in the thickness direction, the conductive plate being bonded to the first surface of the base and electrically connected to the second electrode of the semiconductor element;
   a lead including an island electrically connected to the first electrode; and
   a sealing resin member covering the semiconductor element,
   wherein the first electrode covers the entirety of one surface of the semiconductor element.

2. The semiconductor device according to claim 1, wherein the base is made of ceramic.

3. The semiconductor device according to claim 2, wherein the base is made of alumina.

4. The semiconductor device according to claim 1, wherein the conductive plate is made of metal.

5. The semiconductor device according to claim 4, wherein the conductive plate is made of Cu.

6. The semiconductor device according to claim 1, wherein the conductive plate is not smaller in thickness than the base.

7. The semiconductor device according to claim 1, further comprising a heat dissipation plate bonded to the second surface of the base.

8. The semiconductor device according to claim 7, wherein the heat dissipation plate has an exposed surface exposed from the sealing resin member.

9. The semiconductor device according to claim 8, wherein the exposed surface is flush with one surface of the sealing resin member.

10. The semiconductor device according to claim 7, wherein the heat dissipation plate is made of metal.

11. The semiconductor device according to claim 10, wherein the heat dissipation plate is made of Cu.

12. The semiconductor device according to claim 7, wherein the heat dissipation plate is not smaller in thickness than the base.

13. The semiconductor device according to claim 1, wherein the at least one semiconductor element is a plurality of semiconductor elements, and the island of the lead is electrically connected to the first electrodes of the plurality of semiconductor elements.

14. The semiconductor device according to claim 1, wherein the lead includes a conductive portion electrically connected to the conductive plate of the substrate.

15. The semiconductor device according to claim 1, wherein the island is formed with a plurality of recesses.

16. The semiconductor device according to claim 15, wherein the island has a smooth part that coincides with the semiconductor element.

17. The semiconductor device according to claim 15, wherein each of the recesses is circular in section.

18. The semiconductor device according to claim 15, wherein the plurality of recesses are arranged to surround the semiconductor element.

19. The semiconductor device according to claim 1, wherein the semiconductor element is a power semiconductor element through which an operating current flows.

20. The semiconductor device according to claim 19, further comprising a bonding material that bonds the first electrode and the island.

21. The semiconductor device according to claim 20, wherein the island is formed with a groove located outside the semiconductor element.

22. The semiconductor device according to claim 21, wherein the bonding material lies inside the groove.

23. The semiconductor device according to claim 22, wherein the groove surrounds the semiconductor element as a whole.

24. The semiconductor device according to claim 23, wherein the island is formed with a plurality of recesses located outside the groove.

25. The semiconductor device according to claim 1, wherein the lead includes a terminal that is connected to the island and exposed from the sealing resin member.

26. The semiconductor device according to claim 1, wherein the substrate includes a terminal that protrudes from the sealing resin member.

27. A semiconductor device comprising:
   at least one semiconductor element including a first electrode and a second electrode that are opposite to each other in a thickness direction;
   a substrate including an insulating base and a conductive plate, the insulating base including a first surface and a second surface that are opposite to each other in the thickness direction, the conductive plate being bonded to the first surface of the base and electrically connected to the second electrode of the semiconductor element;
   a lead including an island electrically connected to the first electrode; and
   a sealing resin member covering the semiconductor element,
   wherein the semiconductor element is a power semiconductor element through which an operating current flows, the semiconductor device further comprises a drive IC through which a control current flows for controlling the operating current, and a first wire for connecting the drive IC to the conductive plate of the substrate, and the conductive plate includes an extension that protrudes from the semiconductor element as viewed in plan and is connected to the drive IC via the first wire.

28. The semiconductor device according to claim 27, wherein the extension is provided with a bonding chip to which the first wire is bonded.

29. The semiconductor device according to claim 28, wherein the bonding chip includes a lower layer and an upper layer laminated to the lower layer, the lower layer being closer to the conductive plate than is the upper layer in the thickness direction.

30. The semiconductor device according to claim 29, wherein the lower layer is made of Cu.

31. The semiconductor device according to claim 29, wherein the upper layer is made of Ag.

32. The semiconductor device according to claim 28, further comprising a second wire connected to the drive IC, wherein the second wire includes a first bonding portion, a step portion, a second bonding portion and a reinforced bonding portion, the second bonding portion having a shape that gradually decreases in thickness with increasing distance from the step portion, the reinforced bonding portion overlapping at least a part of the second bonding portion and exposing the step portion.

33. The semiconductor device according to claim 32, wherein the reinforced bonding portion has a disk portion in contact with the second bonding portion.

34. The semiconductor device according to claim 33, wherein the reinforced bonding portion has a column portion that is formed on the disk portion, is smaller in diameter than the disk portion, and is concentric with the disk portion.

35. The semiconductor device according to claim 34, wherein the reinforced bonding portion includes a spire portion formed on the column portion.

36. The semiconductor device according to claim 32, further comprising an annular mark formed by a capillary pressed in forming the second bonding portion.

37. The semiconductor device according to claim 36, wherein the reinforced bonding portion exposes a part of the annular mark.

38. The semiconductor device according to claim 37, wherein the reinforced bonding portion covers at least a half of the annular mark located adjacent to the second bonding portion.

39. The semiconductor device according to claim 32, wherein the first bonding portion is bonded to the drive IC.

40. The semiconductor device according to claim 39, wherein the second bonding portion is bonded to the lead.

41. The semiconductor device according to claim 39, wherein the second boding portion is bonded to the bonding chip.

42. The semiconductor device according to claim 27, wherein the first wire is made of Au.

* * * * *